United States Patent [19]

Torobin

[11] 4,415,512
[45] Nov. 15, 1983

[54] METHOD AND APPARATUS FOR PRODUCING HOLLOW METAL MICROSPHERES AND MICROSPHEROIDS

[76] Inventor: Leonard B. Torobin, Materials Technology Corp., 4174 148th Ave. NE., Redmond, Wash. 98052

[21] Appl. No.: 245,137

[22] Filed: Mar. 18, 1981

Related U.S. Application Data

[60] Continuation-in-part of Ser. No. 103,361, Dec. 13, 1979, Pat. No. 4,303,732, and Ser. No. 103,114, Dec. 13, 1979, Pat. No. 4,303,730, each is a division of Ser. No. 59,297, Jul. 20, 1979, abandoned.

[51] Int. Cl.³ .............................................. C03B 19/10
[52] U.S. Cl. .......................................... 264/9; 264/12; 264/13; 428/546; 428/570
[58] Field of Search ................................ 264/9, 12, 13

[56] References Cited

U.S. PATENT DOCUMENTS

| | | | |
|---|---|---|---|
| 1,871,792 | 8/1932 | Worsfield | 65/21 |
| 2,187,432 | 1/1940 | Powers | 49/1 |
| 2,797,201 | 6/1957 | Veatch et al. | 260/2.5 |
| 3,264,073 | 8/1966 | Schmitt | 29/182 |
| 3,357,808 | 12/1967 | Eberle | 65/7 |
| 3,367,401 | 2/1968 | Bonis et al. | 164/306 |
| 3,719,733 | 3/1973 | Rakestraw et al. | 264/9 |
| 3,765,853 | 10/1973 | Riebling | 65/18 |
| 3,792,136 | 2/1974 | Schmitt | 264/44 |
| 3,845,805 | 11/1974 | Kavesh | 164/89 |
| 3,881,540 | 5/1975 | Kavesh | 164/87 |
| 3,998,618 | 12/1976 | Kreick et al. | 65/105 |
| 4,121,167 | 5/1977 | Niimi et al. | 264/11 |
| 4,133,854 | 1/1979 | Hendricks | 264/10 |
| 4,142,571 | 3/1979 | Narasimhan | 164/88 |
| 4,177,856 | 12/1979 | Liebermann | 164/87 |
| 4,279,632 | 7/1981 | Frosch et al. | 264/9 |
| 4,303,061 | 12/1981 | Torobin | 126/450 |
| 4,303,431 | 12/1981 | Torobin | 264/12 |
| 4,303,432 | 12/1981 | Torobin | 264/12 |
| 4,303,433 | 12/1981 | Torobin | 65/21.4 |
| 4,303,603 | 12/1981 | Torobin | 264/69 |
| 4,303,729 | 12/1981 | Torobin | 428/327 |
| 4,303,730 | 12/1981 | Torobin | 428/333 |
| 4,303,731 | 12/1981 | Torobin | 428/333 |
| 4,303,732 | 12/1981 | Torobin | 428/333 |
| 4,303,736 | 12/1981 | Torobin | 428/403 |
| 4,322,378 | 3/1982 | Hendricks | 264/9 |
| 4,363,646 | 12/1982 | Torobin | 65/5 |

OTHER PUBLICATIONS

Kendal et al., J. Vac. Sci Tech, 20 (4), Apr. 1982, pp. 1091–1093.

*Primary Examiner*—Maurice J. Welsh
*Attorney, Agent, or Firm*—Perry Carvellas

[57] ABSTRACT

Hollow metal microspheres are made by forming a liquid film of molten film forming metal composition across a coaxial blowing nozzle and applying a blowing gas at a positive pressure on the inner surface of the metal film to blow the film and form an elongated cylinder shaped liquid film of molten metal. An inert entraining fluid is directed over and around the blowing nozzle at an angle to the axis of the blowing nozzle so that the entraining fluid dynamically induces a pulsating or fluctuating pressure field at the opposite side of the blowing nozzle in the wake of the coaxial blowing nozzle. The continued movement of the entraining fluid produces asymmetric fluid drag forces on the cylinder and closes and detaches the elongated cylinder from the coaxial blowing nozzle. Surface tension forces acting on the detached cylinder form the latter into a spherical shape which is rapidly cooled and solidified by cooling means to form a hard, smooth hollow metal microsphere. A thin metal coating can be deposited on the inner wall surface of the microspheres by using a metal vapor as the blowing gas or by adding to the blowing gas small dispersed metal particles and/or gases of organometallic compounds which are decomposed. The metal microspheres can be used to make insulation materials systems and as filler materials in plastics, plastic foam compositions, rubber and rubber compositions and in metal compositions. Filamented hollow metal microspheres with a thin metal filament connecting adjacent metal microspheres are also disclosed.

33 Claims, 13 Drawing Figures

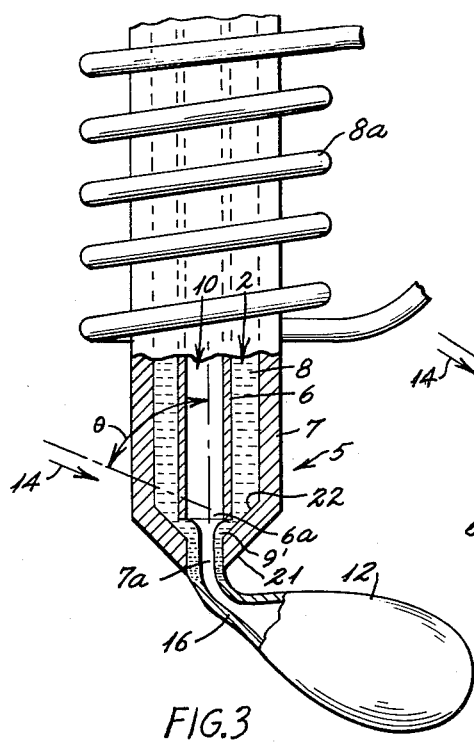
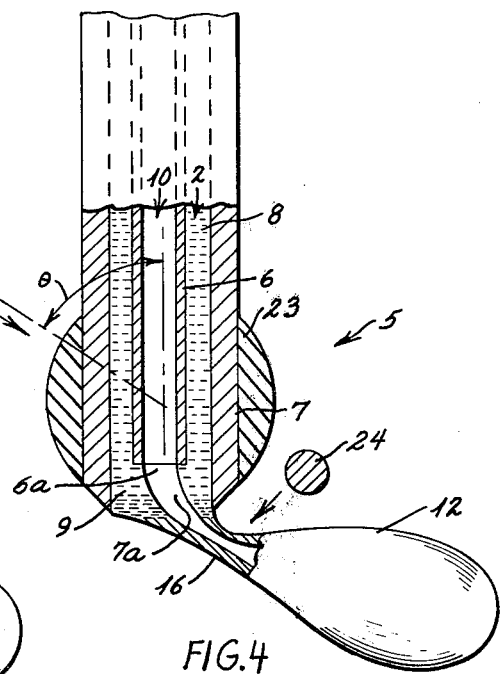
FIG.3    FIG.4
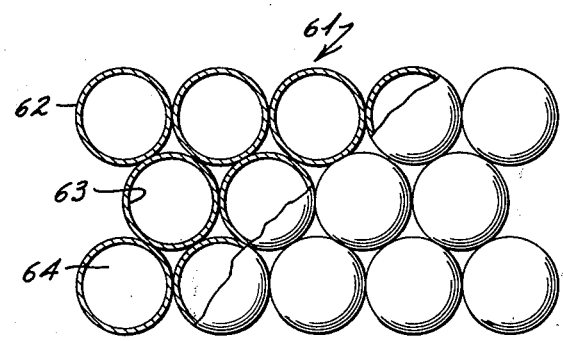
FIG.5
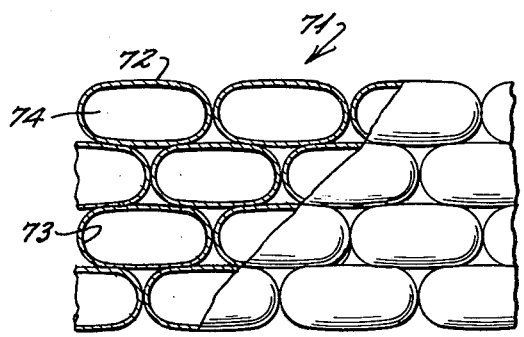
FIG.6

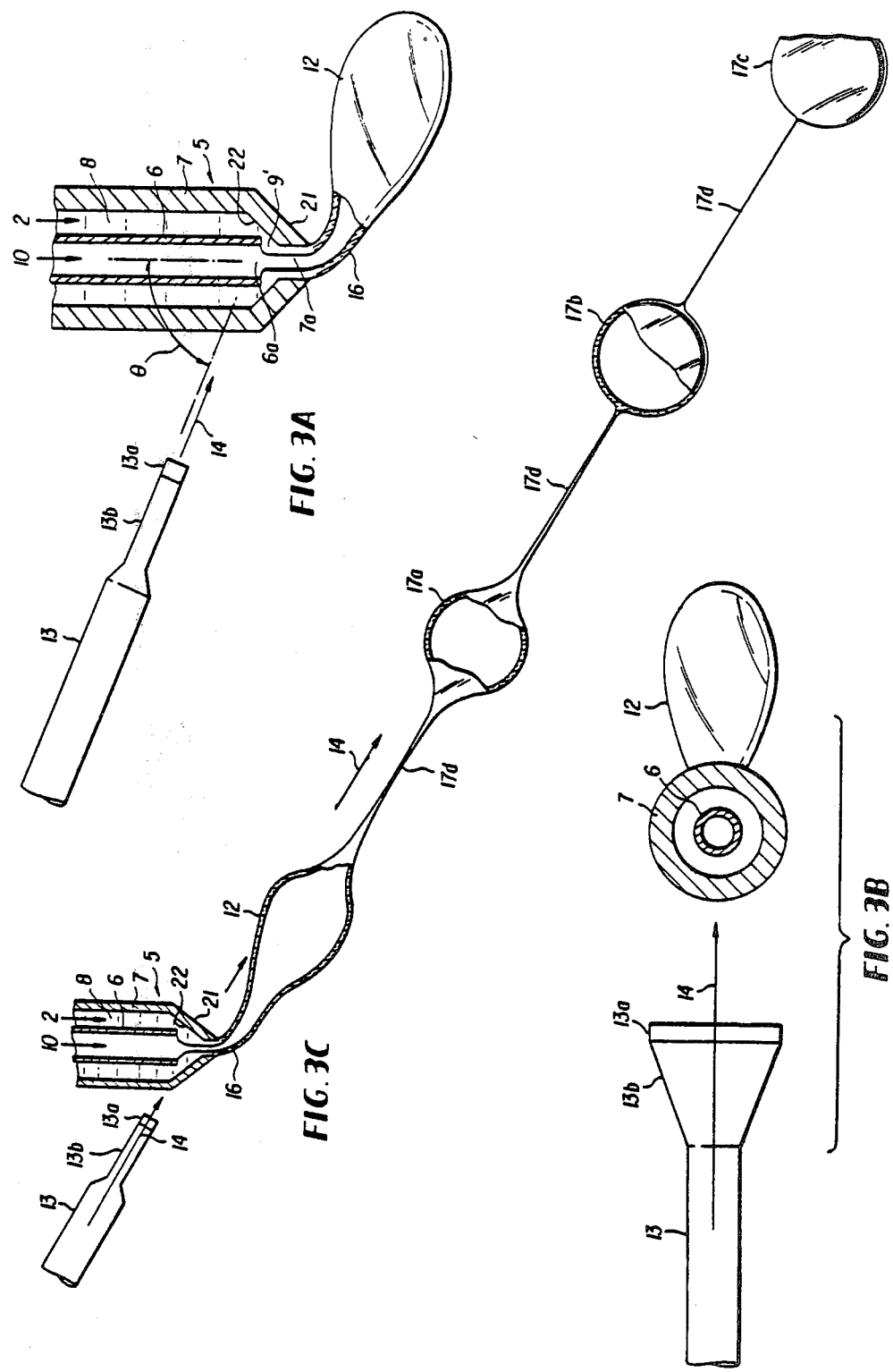

ZINC COATING THICKNESS AS A FUNCTION OF SPHERE DIAMETER AND BLOWN GAS PRESSURE

METHOD AND APPARATUS FOR PRODUCING HOLLOW METAL MICROSPHERES AND MICROSPHEROIDS

SUMMARY OF THE INVENTION

The present application is a continuation-in-part of applicant's copending applications, Ser. Nos. 103,361 and 103,114, both filed Dec. 13, 1979, now U.S. Pat. Nos. 4,303,732 and 4,303,730, respectively which applications are divisional applications of application, Ser. No. 059,297, filed July 20, 1979 (now abandoned); my copending application, Ser. No. 152,693, filed May 23, 1980, now U.S. Pat. No. 4,303,431 which is a continuation of application, Ser. No. 059,297 (now abandoned); which application, Ser. No. 059,297 is a continuation-in-part of applications, Ser. Nos. 937,123 and 944,643, filed Aug. 28, 1978 and Sept. 21, 1978, respectively, (both of which are now abandoned).

The present invention relates to hollow microspheres made from film forming metal materials and compositions and particularly to hollow metal glass microspheres and to a process and apparatus for making the microspheres.

The present invention also relates to hollow metal microspheroids and to a method and apparatus for making hollow metal microspheroids.

The present invention also relates to hollow metal vacuum microspheres having a thin metal coating deposited on the inner wall surface of the microsphere.

The present invention relates to hollow metal microspheres for use as light weight structural materials, as filler materials in plastics and in plastic foam compositions and metal compositions.

The present invention relates to a method and apparatus for using a coaxial blowing nozzle to blow microspheres from liquid film forming metal compositions comprising subjecting the microsphere during its formation to an external pulsating or fluctuating pressure field having periodic oscillations, said pulsating or fluctuating pressure field acting on said microsphere to assist in its formation and to assist in detaching the microsphere from said blowing nozzle.

The invention particularly relates to a method and apparatus for blowing the microspheres from metal glass compositions and particularly to blowing microspheres from a molten metal glass compositions using a coaxial blowing nozzle and an inert blowing gas or a metal vapor to blow the molten metal to form a hollow metal glass microspheres.

The invention also relates to a method and apparatus for blowing the microspheres from film forming liquid metal compositions using a coaxial blowing nozzle and a blowing gas or a blowing gas containing dispersed metal particles and/or an organo metal compound to blow the liquid metal to form a hollow metal microsphere. The metal particles deposit and/or the organo metal compound decomposes to deposit a thin metal coating on the inner wall surface of the metal microsphere.

A transverse jet is used to direct an inert entraining fluid over and around the blowing nozzle at an angle to the axis of the blowing nozzle. The entraining fluid as it passes over and around the blowing nozzle envelops and acts on the molten film forming metal as it is being blown to form the microsphere and to detach the microsphere from the coaxial blowing nozzle. Quench means are disposed close to and below the blowing nozzles to direct a quench fluid onto the microspheres to rapidly cool and solidify the microspheres.

The present invention specifically relates to the use of the hollow metal microspheres and the hollow metal glass microspheres in the manufacture of superior high strength, light weight structural materials for use in construction and in the manufacture of products in which high strength light weight materials are desired or necessary.

The present invention specifically relates to the use of the hollow metal microspheres as filler materials in syntactic foam systems.

The present invention also relates to a method and apparatus for making filamented metal microspheres with thin metal filaments connecting adjacent microspheres and to the filamented microspheres themselves.

The hollow metal microspheres of the present invention, depending on their diameter and their wall thickness and the particular metal composition from which they are made, are capable of withstanding relatively high external pressures and/or weight. Hollow metal microspheres can be made that are stable at relatively high temperatures and resistant to many chemical agents and weathering conditions. These characteristics make the microspheres suitable for a wide variety of uses.

BACKGROUND OF THE INVENTION

In recent years, the substantial increases in costs of basic materials such as metals, metal alloys, plastics, rubbers and the like has encouraged development and use of light weight structural materials, strength adding materials and of filler materials to reduce the amount and cost of the basic materials used and the weight of the finished materials.

The known methods for producing hollow metal microspheres have not been successful in producing microspheres of relatively uniform size or uniform thin walls which makes it very difficult to produce materials of controlled and preditable characteristics, quality and strength.

One of the existing methods of producing hollow metal spheres is disclosed in the Hendricks U.S. Pat. No. 4,133,854. The method disclosed involves dispersing a blowing gas precursor material in the metal to be blown to form the microspheres. The material containing the blowing gas precursor enclosed therein is then heated to convert the precursor material to a gas and is further heated to expand the gas and produce the hollow microsphere containing therein the expanded gas. Another process for making hollow metal spheres is disclosed in Niimi et al, U.S. Pat. No. 4,021,167. This method involves dropping molten metal stream through a nozzle, passing the molten jet metal through a linear water jet which fragments the molten metal into droplets and traps water droplets in the droplets of molten metal. The trapped water droplets expand inside the molten metal droplets to thereby form hollow metal particles.

These processes, particularly the Niimi et al process, are understandably difficult to control and of necessity, i.e. inherently, produce spheres varying in size and wall thickness, spheres with walls that have sections or portions of the walls that are relatively thin, walls that have holes, small trapped bubbles, trapped or dissolved gases, any one or more of which will result in a substantial weakening of the microspheres, and a substantial number or proportion of microspheres which are not suitable for use and must be scrapped or recycled.

In addition, the filamented microspheres of the present invention provide a convenient and safe method of handling the microspheres.

The known methods for producing hollow metal microspheres have not been successful in producing microspheres of uniform size or uniform thin walls and in producing hollow metal microspheres of controlled and predictable physical and chemical characteristics, quality and strength.

OBJECTS OF THE INVENTION

It is an object of the present invention to provide a process and an apparatus for making hollow metal microspheres.

It is another object of the present invention to utilize the hollow metal microspheres of the present invention in the manufacture of improved structural materials and structural systems.

It is another object of the present invention to make hollow metal microspheres for use as and/or in filler materials.

It is another object of the present invention to produce hollow metal microspheres having uniform thin walls which walls are substantially free of trapped gas bubbles or dissolved gases which can form bubbles and/or escape.

It is another object of the present invention to produce hollow metal microspheres which are substantially resistant weathering, chemical agents and alkali materials.

It is still another object of the present invention to utilize the hollow metals microspheres in the manufacture of syntactic foam systems and/or molded forms or shapes.

It is another object of the present invention to produce hollow metal vacuum microspheres having deposited on the inner wall surface thereof a thin metal coating.

It is another object of the present invention to produce in an economical simple manner hollow metal microspheres which are substantially uniform in diameter, wall thickness and strength characteristics.

It is another object of the present invention to utilize the metal glass microspheres of the present invention in the manufacture of superior, high strength, light weight structural materials and/or for use in the manufacture of formed shapes, e.g. structural members and wall panels.

It is another object of the present invention to produce hollow metal filamented microspheres and filamented microspheroids with a thin metal filament connecting adjacent metal microspheres and microspheroids.

It is still another object of the present invention to utilize the hollow metal microspheres of the present invention in the manufacture of insulation materials and insulating systems.

BRIEF DESCRIPTION OF THE INVENTION

The present invention relates to hollow metal microspheres and to a process and apparatus for making the microspheres. The present invention more particularly relates to the use of hollow metal glass microspheres in the manufacture of superior high strength, light weight structural materials and systems, and as improved filler materials.

The microspheres are made from a film forming metal composition and can contain a gas at a relatively low pressure. The microspheres can also be made to contain a high vacuum and a thin metal coating deposited on the inner wall surface of the microspheres.

The microspheres can also be made to contain a gas at above or below or at about ambient pressure and a thin metal coating deposited on the inner wall surface of the microspheres.

The internal metal coating can be reactive with or inert to the metal from which the microsphere is formed.

The metal microspheres of the present invention can be used to form a heat barrier by forming them into sheets or other shaped forms to be used as insulation barriers.

The hollow glass microspheres of the present invention are made by forming a liquid film of molten metal material across a coaxial blowing nozzle, applying an inert gas or metal vapor at a positive pressure on the inner surface of the metal film to blow the film and form an elongated cylinder shaped liquid film of molten metal which is closed at its outer end.

The hollow metal microspheres of the present invention can also be made by applying a gas or a gas containing dispersed metal particles and/or a gaseous organo metal compound at a positive pressure to the inner surface of the metal film to blow the film and form an elongated cylinder shaped liquid film of metal which is closed at its outer end. A balancing but slightly lower gas pressure is provided in the area of the blowing nozzle into which the elongated cylinder shaped liquid metal film is blown.

A transverse jet is used to direct an entraining fluid over and around the blowing nozzle at an angle to the axis of the blowing nozzle. The entraining fluid as it passes over and around the blowing nozzle and the elongated cylinder fluid dynamically induces a pulsating or fluctuating pressure field at the opposite or lee side of the blowing nozzle in the wake or shadow of the blowing nozzle. The fluctuating pressure field has regular periodic lateral oscillations similar to those of a flag flapping in a breeze.

The transverse jet entraining fluid can also be pulsed at regular intervals to assist in controlling the size of the microspheres and in separating the microspheres from the blowing nozzle and the distance or spacing between microspheres.

The entraining fluid envelops and acts asymmetrically on the elongated cylinder and causes the cylinder to flap, fold, pinch and close-off at its inner end at a point proximate to the coaxial blowing nozzle. The continued movement of the entraining fluid over the elongated cylinder produces fluid drag forces on the cylinder and detaches the elongated cylinder from the coaxial blowing nozzle to have it fall free from the blowing nozzle. The surface tension forces of the molten metal act on the now free, entrained elongated cylinder and cause the cylinder to seek a minimum surface area and to form a spherical shape.

Quench nozzles are disposed below and on either side of the blowing nozzle and direct cooling fluid at and into contact with the molten metal microspheres to rapidly cool and solidify the molten metal and form a hard, smooth hollow metal microsphere. Where a metal vapor is used as a blowing gas to blow the microspheres, the quench fluid cools and condenses the metal vapor and causes the metal vapor to deposit on the inner wall surface of the microspheres as a thin metal coating.

In one embodiment of the invention, the microspheres are coated with an adhesive or foam filler and flattened to an oblate spheroid or a generally cellular shape. The microspheres are held in the flattened position until the adhesive hardens and/or cures after which the microspheres retain their flattened shape. The use of the flattened microspheres substantially reduces the volume of the interstices between the microspheres and significantly improves the strength characteristics of the microspheres.

The microspheres can be made from film forming metal compositions selected for their desired strength and chemical resistant properties and for the particular uses intended for the microspheres.

Where a gas containing dispersed metal particles is used to blow the microspheres, a metal layer is deposited on the inner wall surface of the microsphere as a thin metal coating. Where a gaseous organo metal compound is used to deposit the metal layer, a gaseous organo metal compound is used as or with the blowing gas to blow the microspheres. The organo metal compound can be decomposed just prior to blowing the microspheres or after the microspheres are formed by, for example, subjecting the blowing gas or the microspheres to heat and/or an electrical discharge.

The filamented microspheres are made in a manner such that they are connected or attached to each other by a thin continuous metal filament. The method of making the filamented microspheres can be carried out to obtain filamented microspheroids, in the manner discussed more fully below. The filamented microspheres can also be flattened to produce the oblate spheroids. The filaments interrupt and reduce the area of wall to wall contact between the microspheres. The filamented microspheres also assist in handling and preventing scattering of microspheres, particularly where very small diameter microspheres or low density microspheres are produced. The filamented microspheres have a distinct advantage over the simple addition of filaments in that the continuous filaments do not tend to settle in the system in which they are used.

THE ADVANTAGES

The present invention overcomes many of the problems associated with prior attempts to produce hollow metal microspheres. The process and apparatus of the present invention allows the production of hollow metal microspheres having predetermined characteristics such that superior high strength, light weight structural materials and systems, and improved filler materials can be designed, manufactured and tailor made to suit a particular desired use. The diameter, wall thickness and uniformity and the strength and chemical resistance characteristics of the microspheres or microspheroids can be determined by carefully selecting the constituents of the metal composition and controlling the inert gas or metal vapor pressure and the temperature, and the temperature, viscosity, surface tension, and thickness of the molten metal film from which the microspheres are formed. The inner volume of the microspheres may contain an inert low heat conductivity gas used to blow the microsphere or can contain a high vacuum produced by condensing a metal vapor used to blow the microsphere.

The process and apparatus of the present invention provide a practical and economical means by which hollow metal microspheres can be utilized to prepare a relatively low cost, high strength, light weight structural material for every day uses.

The apparatus and process of the present invention also provide for the production of hollow metal microspheres at economic prices and in large quantities.

The process and apparatus of the present invention, as compared to the prior art processes of using a latent liquid or solid blowing agent, can be conducted at higher temperatures since there is no included expandable and/or decompsable blowing agent used. The ability to use higher blowing temperatures results in for particular metal compositions a lower metal viscosity which allows surface tension forces to produce significantly greater uniformity in wall thickness and diameter of the microspheres produced.

The process and apparatus of the present invention allow the use of a wide variety of blowing gases and blowing gas materials to be used and encapsulated.

The present invention provides a method for using a metal vapor blowing gas to blow hollow metal microspheres to obtain a high contained vacuum within the microsphere. The present invention also allows for the addition to metal vapor blowing gas small amounts of selected metal vapors, e.g. alkali metal vapors, to getter, i.e. react with trace gases that may evolve from the molten metal film as the microsphere is being formed. The selected metal vapors getter any evolved gases and maintain the high contained vacuum.

The process and apparatus of the present invention allows the production of hollow metal microspheres for structural, insulation and/or filler uses having predetermined diameters, wall thicknesses, strength and resistance to chemical agents and weathering and gas permeability such that superior systems can be designed, manufactured and tailor made to suit a particular desired use. In addition, the surface of the hollow metal microspheres, because of the method by which they are made, do not have, i.e. are free of sealing tips.

BRIEF DESCRIPTION OF THE DRAWINGS

The attached drawings illustrate exemplary forms of the method and apparatus of the present invention for making microspheres for use in and as structural materials and/or for use in and as filler materials.

The FIG. 1 of the drawings shows in cross-section an apparatus having multiple coaxial blowing nozzle means for supplying the gaseous material for blowing hollow metal microspheres, a transverse jet providing an entraining fluid to assist in the formation and detachment of the microspheres from the blowing nozzles, and means for supplying a quench fluid to cool the microspheres.

Figure 1:
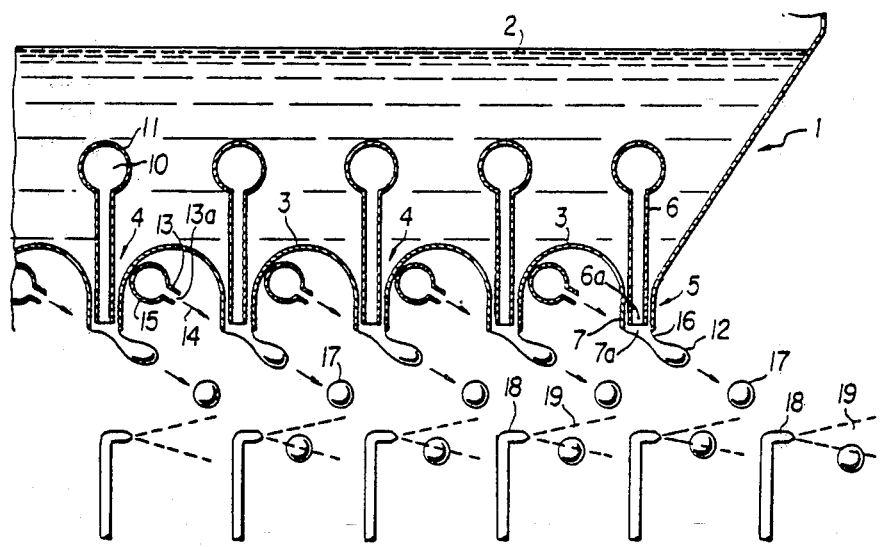
Figure 2:
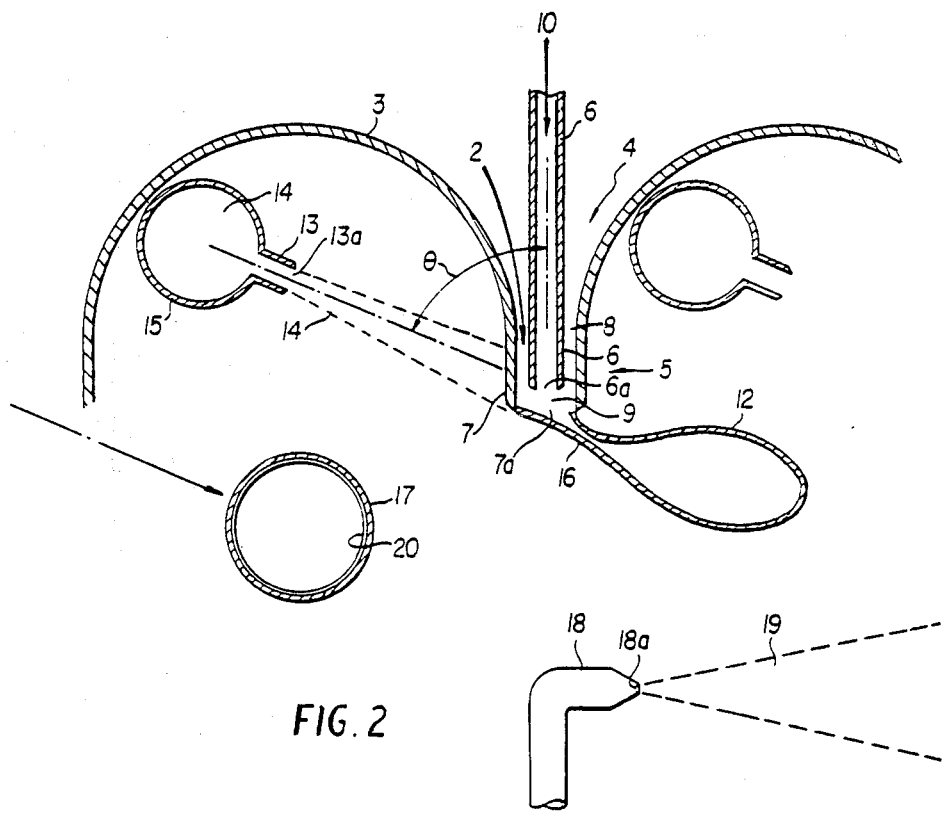

The FIG. 2 of the drawings is an enlarged detailed cross-section of the nozzle means of apparatus shown in FIG. 1.

The FIG. 3 of the drawings is a detailed cross-section of a modified form of the nozzle means shown in FIG. 2 in which the lower end of the nozzle means is tapered inwardly and which is provided with a heating coil.

The FIG. 3a of the drawings is a detailed cross-section of a modified transverse jet entraining means having a flattened orifice opening and the FIG. 3 nozzle means.

The FIG. 3b of the drawings is a top plane view of the modified transverse jet entraining means and the nozzle means illustrated in FIG. 3a of the drawings.

The FIG. 3c of the drawings illustrates the use of the apparatus of FIG. 3b to make filamented hollow metal microspheres.

The FIG. 4 of the drawings is a detailed cross-section of a modified form of the nozzle means shown in FIG. 2 in which the lower portion of the nozzle is enlarged.

The FIG. 5 of the drawings shows a cross-section of a mass of spherical shaped hollow metal microspheres fused or bonded together in a shaped form.

The FIG. 6 of the drawings shows a cross-section of a mass of oblate spheroid shaped hollow metal filamented microspheres fused or bonded together in a shaped form in which filaments interrupt the microsphere wall to wall contact.

Figure 7:
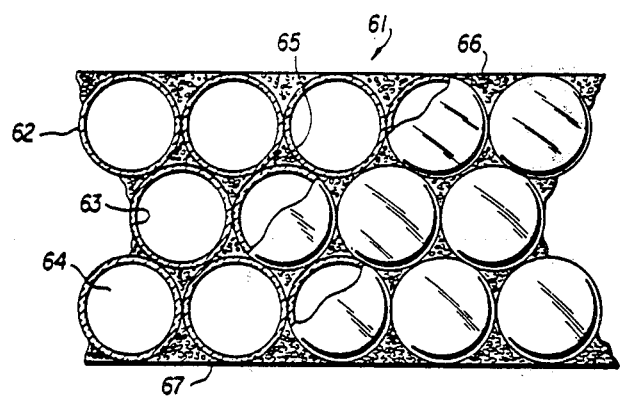

The FIG. 7 of the drawings shows a cross-section of spherical shaped hollow metal microspheres made into a formed structural panel in which the interstices are filled with a fused powdered metal or a hardened molten metal or a plastic material.

Figure 7A:
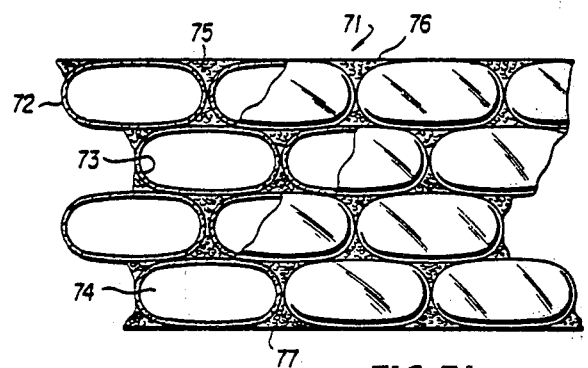

The FIG. 7a of the drawings shows a cross-section of oblate spheroid shaped hollow metal microspheres made into a formed structural panel in which the interstices are filled with a fused powdered metal or a hardened molten metal or a plastic.

Figure 7B:
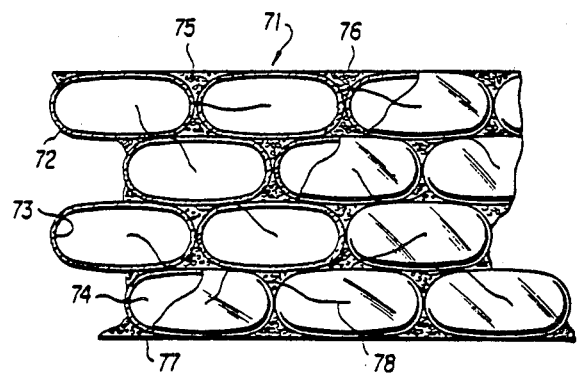

The FIG. 7b of the drawings shows a cross-section of oblate spheroid shaped hollow metal filamented microspheres made into a formed structural panel in which the interstices are filled with a fused powdered metal or a hardened molten metal or plastic and the filaments extend through the interstices and interrupt the microsphere wall to wall contact.

Figure 8:
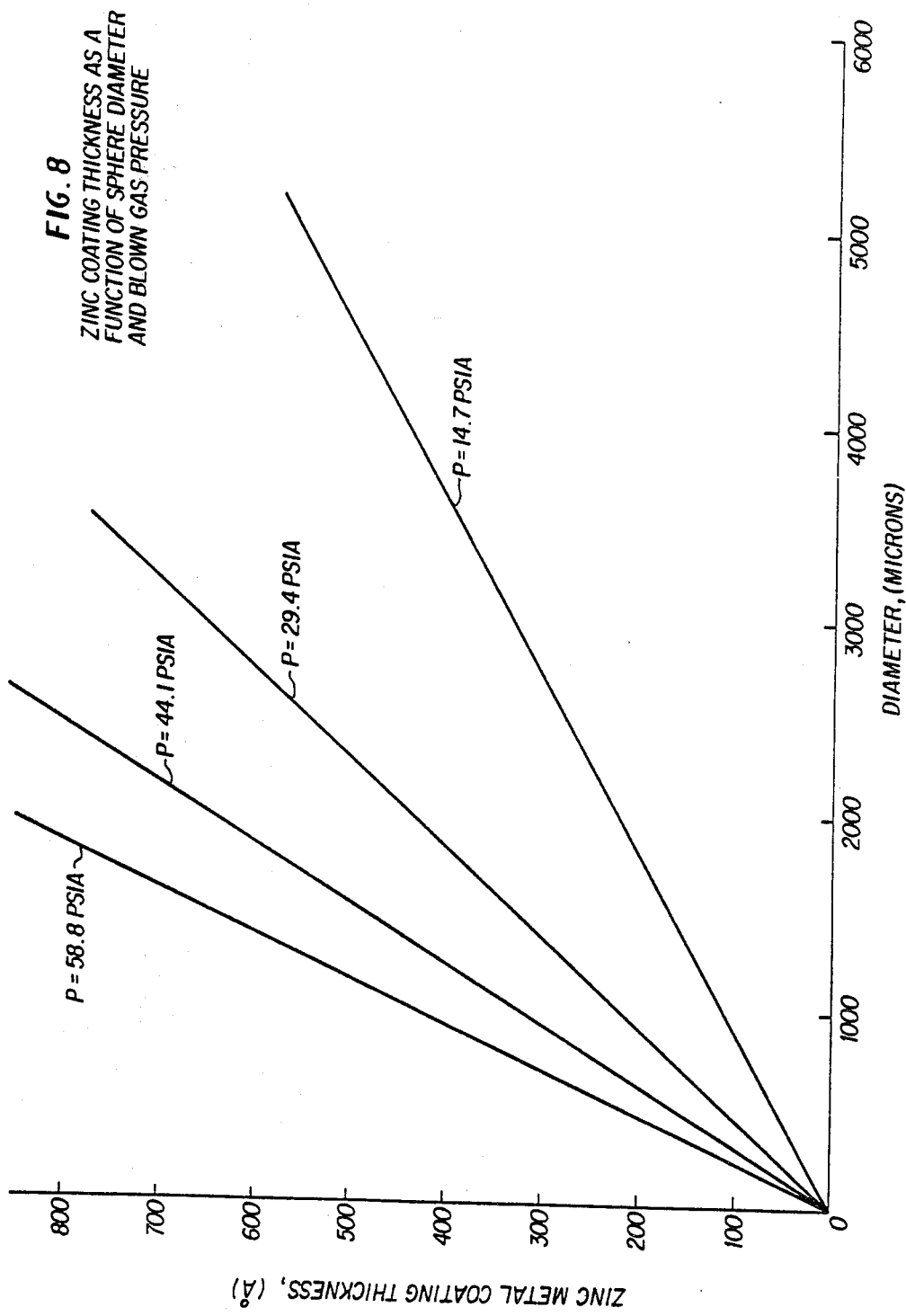

The FIG. 8 of the drawings illustrates in graphic form the relationship between the thickness of the thin metal film, e.g. a zinc film, deposited on the inner wall surface of the hollow microsphere, the metal vapor blowing gas pressure and the diameter* of the microspheres.

*For the purposes of the graphic illustration, the inside and outside diameter of the microspheres are considered to be about the same.

DETAILED DISCUSSION OF THE DRAWINGS

The invention will be described with reference to the accompanying FIGS. 1 to 4 of the drawings wherein like numbers designate like parts throughout the several views.

Referring to FIGS. 1 and 2 of the drawings, there is illustrated a vessel 1, made of suitable refractory material and heated by means not shown for holding molten film forming metal material 2. The bottom floor 3 of vessel 1 contains a plurality of openings 4 through which molten metal 2 is fed to coaxial blowing nozzles 5. The coaxial blowing nozzle 5 can be made separately or can be formed by a downward extension of the bottom 3 of vessel 1. The coaxial blowing nozzle 5 consists of an inner nozzle 6 having an orifice 6a for a blowing gas, an inert blowing gas or metal vapor blowing gas and an outer nozzle 7 having an orifice 7a for molten metal. The inner nozzle 6 is disposed within and coaxial to outer nozzle 7 to form annular space 8 between nozzles 6 and 7, which annular space provides a flow path for molten glass 2. The orifice 6a of inner nozzle 6 terminates at or a short distance above the plane of orifice 7a of outer nozzle 7.

The molten metal 2 at about atmospheric pressure or at elevated pressure flows downwardly through annular space 8 and fills the area between orifice 6a and 7a. The surface tension forces in the molten metal 2 form a thin liquid molten metal film 9 across orifice 6a and 7a.

A blowing gas 10, inert blowing gas, metal vapor blowing gas and/or a blowing gas containing dispersed metal particles, which is heated by means not shown to about the temperature of the molten metal and which is at a pressure above the molten metal pressure at the blowing nozzle, is fed through distribution conduit 11 and inner coaxial nozzle 6 and brought into contact with the inner surface of molten metal film 9. The blowing gas or metal vapor exerts a positive pressure on the molten metal film to blow and distend the film outwardly to form an elongated cylinder shaped liquid film 12 of molten metal filled with the blowing gas or metal vapor 10. The elongated cylinder 12 is closed at its outer end and is connected at its inner end to outer nozzle 7 at the peripheral edge of orifice 7a. A balancing pressure of a gas or of an inert gas, i.e. a slightly lower pressure, is provided in the area of the blowing nozzle into which the elongated cylinder shaped liquid film is blown. The illustrated coaxial nozzle can be used to produce microspheres having diameters three to five times the size of the inside diameter of orifice 7a and is useful in blowing low viscosity metal materials.

A transverse jet 13 is used to direct an inert entraining fluid 14, which is heated to about, below or above the temperature of the molten metal 2, by means not shown. The entraining fluid 14 is fed through distribution conduit 15, nozzle 13 and transverse jet nozzle orifice 13a and directed at the coaxial blowing nozzle 5. The transverse jet 13 is aligned to direct the flow of entraining fluid 14 over and around blowing nozzle 7 in the microsphere forming region at and behind the orifice 7a. The entraining fluid 14 as it passes over and around blowing nozzle 5 fluid dynamically induces a pulsating or fluctuating pressure field in the entraining fluid 14 at the opposite or lee side of blowing nozzle 5 in its wake or shadow.

The entraining fluid 14 envelops and acts on the elongated cylinder 12 in such a manner as to cause the cylinder to flap, fold, pinch and close-off at its inner end at a point 16 proximate to the orifice 7a of outer nozzle 7. The continued movement of the entraining fluid 14 over the elongated cylinder 12 produces fluid drag forces on the cylinder 12 and detaches it from the orifice 7a of the outer nozzle 7 to allow the cylinder to fall, i.e. be entrained and transported away from nozzle 7. The surface tension forces of the molten metal act on the entrained, falling elongated cylinder 12 and cause the cylinder to seek a minimum surface area and to form a spherical shape hollow molten metal microsphere 17.

Quench nozzles 18 having orifices 18a are disposed below and on both sides of coaxial blowing nozzle 5 and direct cooling fluid 19 at and into contact with the molten metal microsphere 17 to rapidly cool and solidify the molten metal and form a hard, smooth hollow metal microsphere. The quench fluid 19 also serves to carry the hollow metal microsphere away from the coaxial blowing nozzle 5. Where a metal vapor is used as a blowing gas to blow the microspheres, the quench fluid cools and condenses the metal vapor to deposit the metal vapor on the inner wall surface of the microsphere as a thin metal coating 20. The cooled and solidified hollow metal microspheres are collected by suitable means not shown.

The FIG. 3 of the drawings illustrates a preferred embodiment of the invention in which the lower portion of the outer coaxial nozzle 7 is tapered downwardly and inwardly at 21. This embodiment as in the previous embodiment comprises coaxial blowing nozzle 5 which consists of inner nozzle 6 with orifice 6a and outer nozzle 7 with orifice 7a. The figure of the drawings also shows elongated cylinder shaped liquid film 12 with a pinched portion 16. This figure of the drawings also shows a heating coil 8a by which the temperature of the film forming molten metal material can be accurately controlled up to the time it is blown to form the hollow metal microspheres.

The use of the tapered nozzle 21 construction was found to substantially assist in the formation of a thin molten metal film 9' in the area between orifice 6a of inner nozzle 6 and orifice 7a of outer nozzle 7. The inner wall surface 22 of the taper portion 21 of the outer nozzle 7 when pressure is applied to molten metal 2 forces the molten metal 2 to squeeze through a fine gap formed between the outer edge of orifice 6a, i.e. the outer edge of the inner nozzle and the inner surface 22 to form the thin molten metal film 9' across orifice 6a and 7a. Thus, the formation of the molten film 9' does not in this embodiment rely solely on the surface tension properties of the molten metal. The illustrated coaxial nozzle can be used to produce microspheres having diameters three to five times the size of the diameter of orifice 7a of coaxial nozzle 7 and allows making microspheres of smaler diameter than those made using the FIG. 2 apparatus and is particularly useful in blowing high viscosity metal materials.

The diameter of the microsphere is determined by the diameter of orifice 7a. The apparatus allows the use of larger inner diameters of outer nozzle 7 and larger inner diameters of inner nozzle 6, both of which reduce the possibility of plugging of the coaxial nozzles when in use. These features are particularly advantageous when the blowing gas contains dispersed metal particles and/or the metal compositions contain additive material particles.

The FIGS. 3a and 3b of the drawings illustrate another preferred embodiment of the invention in which the outer portion of the transverse jet 13 is flattened to form a generally rectangular or oval shaped orifice opening 13a. The orifice opening 13a can be disposed at an angle relative to a line drawn through the central axis of coaxial nozzle 5. The preferred angle, however, is that as illustrated in the drawing. That is, at an angle of about 90° to the central axis of the coaxial nozzle 5.

The use of the flattened transverse jet entraining fluid was found, at a given velocity, to concentrate the effect of the fluctuating pressure field and to increase the amplitude of the pressure fluctuations induced in the region of the formation of the hollow microspheres at the opposite or lee side of the blowing nozzle 5. By the use of the flattened transverse jet and increasing the amplitude of the pressure fluctuations, the pinching action exerted on the cylinder 12 is increased. This action facilitates the closing off of the cylinder 12 at its inner pinched end 16 and detaching of the cylinder 13 from the orifice 7a of the outer nozzle 7.

The FIG. 3c of the drawings illustrates another preferred embodiment of the present invention in which a high viscosity film forming metal material is used to blow hollow metal filamented microspheres. In this Figure, the elongated shaped cylinder 12 and metal microspheres 17a, 17b and 17c are connected to each other by thin metal filaments 17d. As can be seen in the drawing, as the microspheres 17a, 17b and 17c progress away from blowing nozzle 5 surface tension forces act on the elongated cylinder 12 to effect the gradual change of the elongated shaped cylinder 12 to the generally spherical shape 17a, more spherical shape 17b and finally the sperical shape microsphere 17c. The same surface tension forces cause a gradual reduction in the diameter of the connecting filaments 17d, as the distance between the microspheres and filaments and the blowing nozzle 5 increases. The hollow metal microspheres 17a, 17b and 17c that are obtained are connected by thin filament portions 17d that are substantially of equal length and that are continuous with the metal microsphere.

The operation of the apparatus illustrated in FIGS. 3, 3a, 3b and 3c is similar to that discussed above with regard to FIGS. 1 and 2 of the drawings.

The FIG. 4 of the drawings illustrates an embodiment of the invention in which the lower portion of the coaxial nozzle 7 is provided with a bulbous member 23 which imparts to the outer nozzle 7 a spherical shape. This embodiment as in the previous embodiments comprises coaxial blowing nozzle 5 which consists of inner nozzle 6 with orifice 6a and outer nozzle 7 with orifice 7a. The figure of the drawings also shows elongated cylinder shaped liquid film 12 with the pinched portion 16.

The use of the bulbous spherical shaped member 23 was found for a given velocity of entraining fluid 14 (FIG. 2) to substantially increase the amplitude of the pressure fluctuations induced in the region of the formation of the hollow microspheres at the opposite or lee side of the blowing nozzle 5. By the use of the bulbous member 23 and increasing the amplitude of the pressure fluctuations, the pinching action exerted on the elongated cylinder 12 is increased. This action facilitates the closing off of the cylinder 12 at its inner pinched end 16 and detaching the cylinder 12 from the orifice 7a of the outer nozzle 7. When using a bulbous member 23, the transverse jet 13 is aligned such that a line drawn through the center axis of transverse jet 13 will pass through the center of bulbous member 23.

In still another embodiment of the invention which is also illustrated in FIG. 4 of the drawings, a beater bar 24 can be used to assist in detaching the cylinder 12 from orifice 7a. The beater bar 24 is attached to a spindle, not shown, which is caused to rotate in a manner such that the beater bar 24 is brought to bear upon the pinched portion 16 of the elongated cylinder 12 and to thus facilitate the closing off of the cylinder 12 at its inner pinched end 16 and detaching the cylinder 12 from the orifice 7a of outer nozzle 7. The beater bar 24 is set to spin at about the same rate as the formation of hollow microspheres and can be 2 to 1500, preferably 10 to 800 and more preferably 20 to 400 revolutions per second. The film forming metal material microspheres are formed at a rate of 2 to 1500, preferably 10 to 800 and more preferably 20 to 400 per second.

The operation of the apparatus illustrated is otherwise similar to that disclosed above with regard to FIGS. 1, 2, 3 and 4.

The embodiments of the invention illustrated in the FIGS. 2 to 4 can be used singly or in various combinations as the situation may require. The entire apparatus can be enclosed in a high pressure containment vessel, not shown, which allows the process to be carried out at elevated pressures.

The FIGS. 5 to 7 are discussed below with reference to the Examples.

FILM FORMING METAL MATERIAL COMPOSITIONS

The film forming metal material and metal compositions and particularly the metal glass compositions from which the hollow metal microspheres of the present invention are made can be widely varied to obtain the desired physical characteristics for heating, blowing, forming, cooling and hardening the microspheres and the desired weight, strength and gas permeability characteristics of the metal microspheres produced.

The metal compositions can be selected to have a low heat conductivity and sufficient strength when cooled and solidified to, when the microsphere contains a high vacuum, withstand atmospheric pressure. The molten metal composition forms hard microspheres which are capable of contacting adjacent microspheres without significant wear or deterioration at the points of contact and are resistant to deterioration from exposure to moisture, heat and/or weathering.

The constituents of the metal compositions can vary widely, depending on their intended use, and can include small amounts of naturally occuring impurities.

The constituents of the metal compositions can be selected and blended to have high resistance to corrosive gaseous materials, high resistance to gaseous chemical agents, high resistance to alkali and weather, low susceptibility to diffusion of gaseous materials into and out of the metal microspheres, and to be substantially free of trapped gas bubbles or dissolved gases in the walls of the microspheres which can form bubbles and to have sufficient strength when hardened and solidified to support a substantial amount of weight and/or to withstand a substantial amount of pressure.

The film forming metal compositions are formulated to have relatively high melting and fluid flow temperatures with a relatively narrow temperature difference between the melting, i.e. fluid flow and hardening temperatures. The metal compositions are formulated such that they have a high rate of viscosity increase with decreasing temperature so that the microsphere walls will solidify, harden and strengthen before the blowing gas within the sphere decreases in volume and pressure a sufficient amount to cause the microsphere to collapse.

There may be added to the metal compositions chemical agents which affect the viscosity of the compositions in order to obtain the desired viscosities for blowing the microspheres.

The process and apparatus of the present invention can be used to blow microspheres from suitable film forming metal materials or compositions, for example, metal glass alloy compositions, having sufficient viscosity at the temperature at which the microspheres are blown to form a stable elongated cylinder shape of the metal material being blown and to subsequently be detached to form the spherical or spheroid shaped microspheres and on rapid cooling to form a hardened film.

The film forming metal materials of the present invention, e.g. the metal glass alloy compositions depending on the constituents of the compositions, the wall thickness of the microspheres and the quench or cooling rate can form polycrystalline, partially polycrystalline and partially amorphous solid walls and substantially or completely amorphous solid walls.

The quench rates needed to obtain substantially or completely amorphous solids are in the order of $10^{4\circ}$ to $10^{6\circ}$ C. per second. The metal glass microspheres made from compositions which on rapid cooling form substantially amorphous solids are a preferred embodiment of the invention.

The process and apparatus of the invention can be used to form hollow microspheres from metals such as iron, steel, nickel, gold, copper, zinc, tin, brass, lead, aluminum and magnesium. In order to form microspheres from these materials, suitable additives are used which provide at the surface of a blown microsphere a sufficiently high viscosity that a stable microsphere can be formed. The metals to be used to form the microspheres are selected and can be treated and/or mixed with other materials, e.g. other metals, to adjust their viscosity and surface tension characteristics such that at the desired blowing temperatures they form stable films and are capable of forming hollow metal microspheres of the desired size and wall thickness.

To assist in the blowing and formation of the metal microspheres and to control the surface tension and viscosity of the spheres suitable surface active agents, such as colloidal particles of insoluble substances and viscosity stabilizers can be added to the metal composition as additives.

In an embodiment of the present invention metal glass compositions are used as the film forming metal material. The term metal glass(es) as used herein is intended to mean the metal alloy materials and compositions which on rapid cooling from a temperature above their liquidus temperature to below their glass temperature can form amorphous solids.

The term liquidus temperature as used herein is defined as the temperature at which the liquid and crystal phases of a metal alloy composition can exist in equilibrium, that is the temperature at which the crystalline phase can first appear when the liquid is cooled.

The term glass temperature as used herein is defined as the temperature at which the configuration of the metal alloy atoms become frozen in an amorphous solid state.

To form metal(lic) glass(es) it is necessary to rapidly cool the molten metal alloy composition from a temperature of about or just above the liquidus temperature to or below the metal glass temperature at a rate of $10^{4\circ}$ to $10^{6\circ}$ C. per second. Some metal glass or glassy metal alloys at temperatures of about their liquidus temperature can have viscosities of about 10 poises. At the glass temperatures, the metal glass alloy viscosities rapidly increase to about $10^{15}$ poises. Materials that resist change in shape this strongly are rigid enough to be considered solids, and are herein referred to as solids.

There are a wide variety of metal glass alloy compositions which can be used in accordance with the process and apparatus of the present invention to make hollow metal glass microspheres. The metal glass alloys compositions have been broadly described as (1) metal-metalloid alloys (e.g. $Fe_{80}P_{13}C_7$ and $Fe_{80}B_{20}$)*, (2) transition metal alloys (e.g. $Cu_{60}Zr_{40}$ and $Ni_{60}Nb_{40}$) and (3) simple metal alloys (e.g. $Ca_{65}Al_{35}$ and $Ca_{65}Zu_{35}$). The known metal glass alloy compositions include precious metal alloys (e.g. $Pd_{80}Si_{20}$), alkaline earth metal alloys (e.g. $Ca_{70}Mg_{30}$), rare earth metal alloys (e.g. $La_{76}Au_{24}$) and actinide metal alloys (e.g. $U_{70}Cr_{30}$).

*The numbers indicate atomic percent

There is a substantial amount of published literature and a substantial number of patents which disclose various metal glass alloy compositions which are capable of forming partially, substantially or completely amorphous solids.

The Chen et al U.S. Pat. No. 3,856,513 discloses metal glass alloy compositions which can form amorphous solids. The disclosed compositions can contain (a) 75 to 80 atomic percent of iron, nickel, chromium, colbalt, or vanadium, and mixtures thereof, (b) 19 to 22 atomic percent of phosphorous, carbon and boron and mixtures thereof, and (c) 1 to 3 atomic percent of aluminum, antimony, beryllium, germanium, indium, tin and silicon, and mixtures thereof.

The Masumoto et al U.S. Pat. No. 3,986,867 discloses metal glass alloy compositions which form amorphous alloys which have high heat resistance, high corrosion resistance and excellent mechanical properties. The alloy compositions disclosed contain (a) 1 to 40 atomic percent of chromium, (b) 7 to 35 atomic percent of at least one of carbon, boron, and phosphorous and (c) the remainder iron.

The Ray et al U.S. Pat. No. 4,366,638 discloses binary amorphous alloy compositions of iron or cobalt and boron which have high mechanical hardness and soft magnetic properties. These alloys contain (a) 75 to 85 atomic percent iron or cobalt and (b) 15 to 25 atomic percent boron.

The Ray U.S. Pat. Nos. 4,210,443 and 4,221,592 also disclose metal glass alloy compositions which form amorphous solids.

The disclosures of each of the five above-mentioned patents are incorporated by reference herein in their entirety.

It is to be understood that some metal glass alloy compositions are better glass formers, i.e. capable of forming amorphous solids, than others. The better alloy compositions can be obtained as amorphous solids, i.e. in the amorphous state, at lower cooling rates and/or microspheres can be obtained with relatively thicker walls when quenched from the molten liquid phase.

The metal glass alloy compositions that are capable, when rapidly quenched, of forming hollow microspheres or microspheroids are intended to come within the scope of the present invention.

The metal compositions from which the hollow metal microspheres can be made may, depending on the particular metal materials used, to some degree, be permeable to the gas materials used to blow the microspheres and/or to the gases present in the medium surrounding the microspheres. The gas permeability of the metal compositions can be controlled, modified and/or reduced or substantially eliminated by the addition, prior to blowing the microspheres, to the metal composition of very small inert laminar plane-orientable additive material particles. When any one or more of these laminar plane-orientable additive material particles are added to a metal composition prior to the blowing and formation of the hollow metal microsphere, the process of making the microsphere aligns the laminar particles, as the metal film is stretched in passing, i.e. extruded, through the conical blowing nozzle, with the walls of the hollow metal microsphere and normal to the gas diffusion direction. The presence of the laminar plane particles in the microsphere walls substantially diminishes the gas permeability of the metal film. The sizes of the additive particles are advantageously selected to be less than one-half the thickness of the wall of the microspheres.

BLOWING GAS

The hollow microspheres and particularly the metal glass microspheres can be blown with a gas, an inert gas, an inert metal vapor or gas containing dispersed metal particles or mixtures thereof.

The inert gases used to blow the microspheres can be selected to have a low heat conductivity and involve heavy molecules which do not transfer heat readily. Suitable blowing gases are argon, xenon, carbon dioxide, nitrogen, nitrogen dioxide, sulfur and sulfur dioxide. Organo metal compounds can also be used as a blowing gas. The blowing gas is selected to have the desired internal pressure when cooled to ambient temperatures. When sulfur, for example, is used as a blowing gas, the sulfur condenses and a partial vacuum can be formed in the microsphere.

Blowing gases can also be selected that react with or form an alloy with the metal film forming material or composition, e.g. the metal glass microspheres, for example, to assist in the hardening of the microspheres or to make the microsphere less permeable to the contained blowing gases. The blowing gases can also be selected to react or form an alloy with the deposited thin metal layer to obtain desired characteristics in the deposited metal layer. For certain uses, oxygen or air can be used as or added to the blowing gas.

The metal vapor is used as a blowing gas to obtain a substantial vacuum in the contained volume of the microsphere and to deposit a thin metal coating on the inner wall surface of the hollow metal microsphere. The specific metal used as well as the thickness and nature of metal coating deposited will determine the properties of the deposited metal.

Small amounts of other metal vapors, e.g. alkali metals, that act as gettering materials can be added to the metal vapor blowing gas. The gettering materials react with gases evolved from the molten metal film during the formation of the microspheres and maintain the hard contained vacuum.

The metal vapor blowing gases such as zinc, antimony, barium, cadmium, cesium, bismuth, selenium, lithium, magnesium, and potassium can be used. Zinc and selenium, however, are preferred and zinc is particularly preferred.

An auxilliary blowing gas, e.g. an inert blowing gas can advantageously be used in combination with a metal vapor blowing gas to assist in the control of the cooling and solidification of the hollow molten metal microsphere.

A blowing gas containing dispersed metal particles can be used to obtain in the contained volume of the microsphere a deposit of a thin metal coating on the inner wall surface of the hollow metal microsphere.

The metal used to coat the inner wall surface of the hollow metal microspheres is selected to have the desired characteristics and to adhere to the inner wall surface of the metal microspheres. The thickness of the deposited metal coating will depend to some extent upon the metal, the particle size of the metal used, the size of the microspheres and the amount of dispersed metal particles used.

The dispersed metal particle size can be 25 Å to 10,000 Å, preferably 50 Å to 5,000 Å and more preferable 100 Å to 1,000 Å. A sufficient amount of the metal is dispersed in the blowing gas to obtain the desired thickness of the deposited metal. The dispersed metal particles can advantageously be provided with an electrostatic charge to assist in depositing them on the inner wall surface of the microspheres.

Metal particles such as aluminum, silver, nickel, zinc, antimony, barium, cadmium, cesium, bismuth, selenium, lithium, magnesium, potassium, and gold can be used. Aluminum, zinc and nickel, however, are preferred. Dispersed metal oxide particles can in a similar manner be used to obtain similar effects to that of the dispersed metal particles.

The thin metal coating can also be deposited on the inner wall surface of the microsphere by using as or with blowing gas organo metal compounds that are gases at the blowing temperatures. Of the organo metal compounds available, the organo carbonyl compounds are preferred. Suitable organo metal carbonyl compounds are nickel and iron.

The organo metal compounds can be decomposed by heating just prior to blowing the microspheres to obtain finely dispersed metal particles and a decomposition gas. The decomposition gas, if present, can be used to assist in blowing the microspheres. The dispersed metal particles from decomposition of the organo metal compound, as before, deposit to form the thin metal layer. Alternatively, the microsphere, after being formed and containing the gaseous organo metal compound blowing gas, can be subjected to an "electric discharge" means which decomposes the organo metal compound to form the finely dispersed metal particles and the decomposition gas.

The thickness of the deposited metal layer will depend primarily on the partial pressure of the gaseous organo metal blowing gas and the inside diameter of the microsphere.

An auxiliary blowing gas can be used to dilute the gaseous organo metal compound blowing gas in order to control the thickness of the deposited metal layer. There can also be used as an auxiliary blowing gas, a gas that acts as a catalyst for the decomposition of the organo metal compound or as a hardening agent for the film forming metal compositions. The addition of the catalyst or hardening agent to the blowing gas prevents contact of the catalyst with the organo metal compound or the hardening agent with the metal composition until a time just before the microsphere is formed.

The blowing gas or metal vapor blowing gas can be selected to react with and/or form an alloy with the inner wall surface of the microsphere. The blowing gas reacting with and/or the forming of an alloy on the inner wall surface of the microsphere as it is being blown and formed can to some extent help to stabilize (against break-up) the film forming metal material used to form the microsphere wall and allow sufficient time for the microsphere to form and harden.

A distinct and advantageous feature of the present invention is that latent solid or latent liquid blowing gases are not used or required and that the microspheres that are produced are free of latent solid or latent liquid blowing gas materials or gases.

THE ENTRAINING FLUID

The entraining fluid can be a gas at a high or low temperature and can be selected to react with or be inert to the metal composition. The entraining fluid, e.g. an inert entraining fluid, can be a high temperature gas. Suitable entraining fluids are nitrogen, air, steam and argon.

An important feature of the present invention is the use of the transverse jet to direct the inert entraining fluid over and around the coaxial blowing nozzle. The entraining fluid assists in the formation and detaching of the hollow molten metal microsphere from the coaxial blowing nozzle.

THE QUENCH FLUID

The quench fluid can be a liquid, a liquid dispersion or a gas. Suitable quench fluids are water, a fine water spray, brine, air, nitrogen, or liquid nitrogen, helium or argon gases.

The inert quench fluid can also be ethylene glycol vapor or dispersion. The hollow molten metal microspheres immediately after they are formed are rapidly quenched and cooled to solidy, harden and strengthen the metal microspheres before the internal gas pressure is reduced to such a low value that the microsphere collapses. The selection of a specific quench fluid and quench temperature depends to some extent on the film forming metal composition from which the microsphere was formed and on the blowing gas or metal vapor used to blow the microsphere and on the metal and nature of the deposited metal film desired.

PROCESS CONDITIONS

The film forming metal materials and/or compositions of the present invention are heated to a temperature at which they are molten, e.g. above their liquidus temperature and maintained in a liquid, fluid form during the blowing operation.

Many of the known metal glass alloy compositions have liquidus temperatures within the range of 900° to 1200° C. and glass temperatures within the range of 300° to 500° C. depending on the constituents of the compositions.

The film forming metal compositions at temperatures at which they are molten, e.g. above their liquidus temperatures are fluid and flows easily. The molten film forming metal composition, however, just prior to the blowing operation, i.e. just before beginning of the formation of the microsphere, can have a viscosity of 10 to 600 poises, preferably 20 to 350, and more preferably 30 to 200 poises.

Where the process is used to make non-filamented microspheres, the liquid film forming metal composition just prior to the blowing operation can have a viscosity of 10 to 200 poises, preferably 20 to 100 poises, and more preferably 25 to 75 poises.

Where the process is used to make filamented microspheres, the liquid film forming metal composition just prior to the blowing operation can have a viscosity of 50 to 600 poises, preferably 100 to 400 poises, and more preferably 150 to 300 poises.

A feature of the present invention is that the formation of the hollow metal microspheres can be carried out at low viscosities. Because of the ability to utilize comparatively low viscosities, applicant is able to obtain hollow metal microspheres, the wall of which are free of any entrapped or dissolved gases or bubbles. With the low viscosities used by applicant, any entrapped or dissolved gases diffuse out and escape from the metal film surface during the bubble formation.

The molten or liquid metal fed to the coaxial blowing nozzle can be at about ambient pressure or can be at an elevated pressure. The molten or liquid metal feed can be at a pressure of 1 to 20,000 p.s.i.g., usually 3 to 10,000 p.s.i.g. and more usually 5 to 5,000 p.s.i.g. The molten metal feed when used for low pressure applications can be at a pressure of 1 to 1000 p.s.i.g., preferably 3 to 500 p.s.i.g. and more preferably 5 to 100 p.s.i.g.

Where the process is used to make microspheres for use in syntactic foam systems, the liquid metal fed to the coaxial blowing nozzle can be at a pressure of 1 to 1,000 p.s.i.g., preferably at 3 to 100 p.s.i.g., and more preferably at 5 to 50 p.s.i.g.

The molten film forming metal composition is continuously fed to the coaxial blowing nozzle during the blowing operation to prevent premature breaking and detaching of the elongated cylinder shaped molten metal liquid film as it is being formed by the blowing gas.

The blowing gas, inert blowing gas, gaseous material blowing gas or metal vapor blowing gas will be at about the same temperature as the molten metal being blown. The blowing gas temperature can, however, be at a higher temperature than the molten metal to assist in maintaining the fluidity of the hollow molten metal microsphere during the blowing operation or can be at a lower temperature than the molten glass to assist in the solidification and hardening of the hollow molten metal microsphere as it is formed. The pressure of the blowing gas is sufficient to blow the microsphere and will be slightly above the pressure of molten metal at the orifice 7a of the outer nozzle 7. The blowing gas pressure will also depend on and be slightly above the ambient pressure external to the blowing nozzle.

The temperatures of the blowing gases will depend on the blowing gas used and the viscosity-temperature-shear relationship of the film forming metal materials used to make the microspheres.

The metal vapor blowing gas temperature will be sufficient to vaporize the metal and will be at about the same temperature as the molten metal composition being blown. The metal vapor blowing gas temperature can, however, be at a higher temperature than the molten metal to assist in maintaining the fluidity of the hollow molten metal microsphere during the blowing operation or can be at a lower temperature than the molten metal to assist in the solidification and hardening of the hollow molten metal microsphere as it is formed. The pressure of the metal vapor blowing gas is sufficient to blow the microsphere and will be slightly above the pressure of molten metal at the orifice 7a of the outer nozzle 7. The metal vapor blowing gas pressure will also depend on and be slightly above the ambient pressure external to the blowing nozzle.

The pressure of the blowing gas or gaseous material blowing gas, including the metal vapor blowing gas, is sufficient to blow the microsphere and will be slightly above the pressure of liquid metal at the orifice 7a of the outer nozzle 7. Depending on the gaseous material to be encapsulated within the hollow metal microspheres, the blowing gas or the gaseous material can be at a pressure of 1 to 20,000 p.s.i.g., usually 3 to 10,000 p.s.i.g. and more usually 5 to 5,000 p.s.i.g.

The blowing gas or gaseous material blowing gas can also be at a pressure of 1 to 1,000 p.s.i.g., preferably 3 to 500 p.s.i.g. and more preferably 5 to 100 p.s.i.g.

Where the process is used to make microspheres for use as structural materials and in structural systems, for use in syntactic foam systems and as filler materials in general, the blowing gas or gaseous material blowing gas can be at a pressure of 1 to 1,000 p.s.i.g., preferably at 3 to 100 p.s.i.g. and more preferably at 5 to 50 p.s.i.g.

The pressure of the blowing gas containing dispersed metal particles alone and/or in combination with the principal blowing gas is sufficient to blow the microsphere and the combined gas pressure will be slightly above the pressure of the liquid film forming metal composition at the orifice 7a of the outer nozzle 7. The pressure of the combined mixture of the blowing gases will also depend on and be slightly above the ambient pressure external to the blowing nozzle.

The ambient pressure external to the blowing nozzle can be at about atmospheric pressure or can at at subatmospheric or super-atmospheric pressure. Where it is desired to have a relatively or high pressure of contained gas in the microsphere or to deposit a relatively thick coating of metal within a vacuum microsphere, the ambient pressure external to the blowing nozzle is maintained at a super-atmospheric pressure. The ambient pressure external to the blowing nozzle will, in any event, be such that it substantially balances, but is slightly less than the blowing gas pressure.

The transverse jet inert entraining fluid which is directed over and around the coaxial blowing nozzle to assist in the formation and detaching of the hollow molten metal microsphere from the coaxial blowing nozzle can be at about the temperature of the molten metal being blown. The entraining fluid can, however, be at a higher temperature than the molten metal to assist in maintaining the fluidity of the hollow molten metal microsphere during the blowing operation or can be at a lower temperature than the molten glass to assist in the stabilization of the forming film and the solidification and hardening of the hollow molten metal microsphere as it is formed.

The transverse jet entraining fluid which is directed over and around the coaxial blowing nozzle to assist in the formation and detaching of the hollow liquid metal microsphere from the coaxial blowing nozzle can have a linear velocity in the region of microsphere formation of 1 to 120 ft/sec, usually 5 to 80 ft/sec and more usually 10 to 60 ft/sec.

Where the process is used to make non-filamented microspheres, the linear velocity of the transverse jet fluid in the region of microsphere formation can be 30 to 120 ft/sec, preferably 40 to 100 ft/sec and more preferably 50 to 80 ft/sec.

Where the process is used to make filamented microspheres, the linear velocity of the transverse jet fluid in the region of microsphere formation can be 1 to 50 ft/sec, preferably 5 to 40 ft/sec and more preferably 10 to 30 ft/sec.

Further, it is found (FIGS. 2 to 4) that pulsing the transverse jet entraining fluid at a rate of 2 to 1500 pulses/sec, preferably 50 to 1000 pulses/sec and more preferably 100 to 500 pulses/sec assist in controlling the diameter of the microspheres and the length of the filament portion of the filamented microspheres and detaching the microspheres from the coaxial blowing nozzle.

The distance between filamented microspheres depends to some extent on the viscosity of the metal and the linear velocity of the transverse jet entraining fluid.

The entraining fluid can be at the same temperature as the liquid metal being blown. The entraining fluid can, however, be at a higher temperature than the liquid metal to assist in maintaining the fluidity of the hollow liquid metal microsphere during the blowing operation or can be at a lower temperature than the liquid metal to assist in the stabilization of the forming film and the solidification and hardening of the hollow liquid metal microsphere as it is formed.

The quench fluid is at a temperature such that it rapidly cools the hollow molten metal microsphere to solidify, harden and strengthen the molten metal before the inner gas pressure or metal vapor pressure decreases to a value at which the metal microsphere would collapse. The quench fluid can be at a temperature of 0° to 200° F., preferably 40° to 200° F. and more preferably 50° to 100° F. depending to some extent on the composition of the film forming metal composition to be cooled.

Where aqueous brine or ethylene glycol dispersions are used, quench temperatures of −60° C. and −50° C., respectively, can be obtained.

Where very rapid or high cooling rates are desired, cryogenic fluids such as liquid nitrogen, helium or argon can be used.

Where cryogenic fluids are used to cool the microspheres, temperatures as low as −195° C. for nitrogen, −268° C. for helium, and −185° C. for argon can be obtained in the vicinity of the microspheres by use of dispersed sprays of the cryogenic fluids.

The quench fluid very rapidly cools the outer molten metal surface of the microsphere with which it is in contact and more slowly cools the blowing gas or metal vapor enclosed within the microsphere because of the lower thermal conductivity of the contained blowing gas or metal vapor. This cooling process allows sufficient time for the metal walls of the microspheres to strengthen before the gas is cooled or the metal vapor is cooled and condensed and a high vacuum formed within the metal microsphere.

Where a metal vapor blowing gas is used, hard vacuums of $10^{-4}$ to $10^{-6}$ Torr can be obtained in the contained volume of the microsphere.

The time elapsed from commencement of the blowing of the metal microspheres to the cooling and hardening of the microspheres can be 0.0001 to 1.0 second, preferably 0.0010 to 0.50 second and more preferably 0.010 to 0.10 second. Suitable cooling rates are of the order of $10^{4°}$ to $10^{6°}$ C., per second, i.e. about $1.8 \times 10^{4}$ to $1.8 \times 10^{6°}$ F. per second. When cooling the metal glass compositions of the present invention to obtain amorphous metal microspheres cooling rates of $10^{4°}$ to $10^{6°}$ C. per second are preferred. The quench rate required will to some extent depend on the wall thickness of the microsphere.

The filamented microsphere embodiment of the invention provides a means by which the microspheres may be suspended and allowed to harden and strengthen without being brought into contact with any surface. The filamented microspheres are simply drawn on a blanket or drum and are suspended between the blowing nozzle and the blanket or drum for a sufficient period of time for them to harden and strengthen. This procedure can be used where desired to form oblate spheroid shaped microspheres.

APPARATUS

Referring to FIGS. 1 and 2 of the drawings, the refractory vessel 1 is constructed to maintain the molten film forming metal material at the desired operating temperatures. The molten film forming metal material 2 is fed to coaxial blowing nozzle 5. The coaxial blowing nozzle 5 consists of an inner nozzle 6 having an outside diameter of 0.32 to 0.010 inch, preferably 0.20 to 0.015 inch and more preferably 0.10 to 0.020 inch and an outer nozzle 7 having an inside diameter of 0.420 to 0.020 inch, preferably 0.260 to 0.025 and more preferably 0.130 to 0.030 inch. The inner nozzle 6 and outer nozzle 7 form annular space 8 which provides a flow path through which the molten glass 2 is extruded. The distance between the inner nozzle 6 and outer nozzle 7 can be 0.050 to 0.004, preferably 0.030 to 0.005 and more preferably 0.015 to 0.008 inch.

The orifice 6a of inner nozzle 6 terminates a short distance above the plane of orifice 7a of outer nozzle 7. The orifice 6a can be space above orifice 7a at a distance of 0.001 to 0.125 inch, preferably 0.002 to 0.050 inch and more preferably 0.003 to 0.025 inch. The molten film forming metal material 2 flows downwardly and is extruded through annular space 8 and fills the area between orifice 6a and 7a. The surface tension forces in the molten film forming metal material 2 form a thin liquid molten film forming metal material film 9 across orifice 6a and 7a which has about the same or a smaller thickness as the distance of orifice 6a is spaced above orifice 7a. The orifices 6a and 7a can be made from quartz, zirconia or fused alumina. The surface tension forces in the liquid film forming metal material 2 form a thin liquid film forming metal material film 9 across orifices 6a and 7a which has about the same or a smaller thickness as the distance of orifice 6a is spaces above orifice 7a. The molten film forming metal material film 9 can be 25 to 3175 microns, preferably 50 to 1270 microns and more preferably 76 to 635 microns thick.

The FIG. 2 blowing nozzle can be used to blow molten film forming metal material at relatively low viscosities, for example, of 10 to 60 poises, and to blow hollow film forming metal material microspheres of relatively thick wall size, for example, of 20 to 100 microns or more.

A blowing gas, inert blowing gas, gaseous material blowing gas or metal vapor blowing gas is fed through inner coaxial nozzle 6 and brought into contact with the inner surface of molten film forming metal material film 9. The inert blowing gas exerts a positive pressure on the molten metal material film to blow and distend the film outwardly and downwardly to form an elongated cylinder shaped liquid film 12 of molten film forming metal material filled with the blowing gas 10. The elongated cylinder 12 is closed at its outer end and is connected to outer nozzle 7 at the peripheral edge of orifice 7a.

The transverse jet 13 is used to direct an inert entraining fluid 14 through nozzle 13 and transverse jet nozzle orifice 13a at the coaxial blowing nozzle 5. The coaxial blowing nozzle 5 has an outer diameter of 0.52 to 0.030 inch, preferably 0.36 to 0.035 inch and more preferably 0.140 to 0.040 inch.

The process of the present invention was found to be very sensitive to the distance of the transverse jet 13 from the orifice 7a of outer nozzle 7, the angle at which the transverse jet was directed at coaxial blowing nozzle 5 and the point at which a line drawn through the center axis of transverse jet 13 intersected with a line drawn through the center axis of coaxial nozzle 5. The transverse jet 13 is aligned to direct the flow of entraining fluid 14 over and around outer nozzle 7 in the microspheres forming region of the orifice 7a. The orifice 13a of transverse jet 13 is located a distance of 0.5 to 14 times, preferably 1 to 10 times and more preferably 1.5 to 8 times and still more preferably 1.5 to 4 times the outside diameter of coaxial blowing nozzle 5 away from the point of intersect of a line drawn along the center axis of transverse jet 13 and a line drawn along the center axis of coaxial blowing nozzle 5. The center axis of transverse jet 13 is aligned at an angle of 15° to 85°, preferably 25° to 75° and more preferably 35° to 55° relative to the center axis of the coaxial blowing nozzle 5. The orifice 13a can be circular in shape and have an inside diameter of 0.32 to 0.010 inch, preferably 0.20 to 0.015 inch and more preferably 0.10 to 0.020 inch.

The line drawn through the center axis of transverse jet 13 intersects the line drawn through the center axis of coaxial blowing nozzle 5 at a point above the orifice 7a of outer nozzle 7 which is 0.5 to 4 times, preferably 1.0 to 3.5 times and more preferably 2 to 3 times the outside diameter of the coaxial blowing nozzle 5. The transverse jet entraining fluid acts on the elongated shaped cylinder 12 to flap and pinch it closed and to detach it from the orifice 7a of the outer nozzle 7 to allow the cylinder to fall free, i.e. be transported away from the outer nozzle 7 by the entraining fluid.

The transverse jet entraining fluid as it passes over and around the blowing nozzle fluid dynamically induces a periodic pulsating or fluctuating pressure field at the opposite or lee side of the blowing nozzle in the wake or shadow of the coaxial blowing nozzle. A similar periodic pulsating or fluctuating pressure field can be produced by a pulsating sonic pressure field directed at the coaxial blowing nozzle. The entraining fluid assists in the formation and detaching of the hollow film forming metal material microspheres from the coaxial blowing nozzle. The use of the transverse jet and entraining fluid in the manner described also discourages wetting of the outer wall surface of the coaxial blowing nozzle 5 by the molten film forming metal material being blown. The wetting of the outer wall disrupts and interferes with blowing the microspheres.

The quench nozzles 18 are disposed below and on both sides of coaxial blowing nozzle 5 a sufficient distance apart to allow the microspheres 17 to fall between the quench nozzles 18. The inside diameter of quench nozzle orifice 18a can be 0.1 to 0.75 inch, preferably 0.2 to 0.6 inch and more preferably 0.3 to 0.5 inch. The quench nozzles 18 direct cooling fluid 19 at and into contact with the molten film forming metal material microspheres 17 at a velocity of 2 to 14, preferably 3 to 10 and more preferably 4 to 8 ft/sec to rapidly cool and solidify the molten film forming metal material and form a hard, smooth hollow film forming metal material microsphere.

The FIG. 3 of the drawings illustrates a preferred embodiment of the invention. It was found that in blowing molten film forming metal material compositions at high viscosities that it was advantageous to immediately prior to blowing the molten film forming metal material to provide by extrusion a very thin molten film forming metal material liquid film for blowing into the elongated cylinder shape liquid film 12. The thin molten film forming metal material liquid film 9' is provided by having the lower portion of the outer coaxial nozzle 7 tapered downwardly and inwardly at 21. The tapered portion 21 and inner wall surface 22 thereof can be at an angle of 15° to 75°, preferably 30° to 60° and more preferably about 45° relative to the center axis of coaxial blowing nozzle 5. The orifice 7a' can be 0.10 to 1.5 times, preferably 0.20 to 1.1 times and more preferably 0.25 to 0.8 times the inner diameter of orifice 6a of inner nozzle 6.

The thickness of the molten film forming metal material liquid film 9' can be varied by adjusting the distance of orifice 6a of inner nozzle 6 above orifice 7a of outer nozzle 7 such that the distance between the peripheral edge of orifice 6a and the inner wall surface 22 of tapered nozzle 21 can be varied. By controlling the distance between the peripheral edge of orifice 6a and the inner wall surface 22 of the tapered nozzle to form a very fine gap and by controlling the pressure applied to feed the molten film forming metal material 2 through annular space 8 the molten film forming metal material glass 2 can be squeezed or extruded through the very fine gap to form a relatively thin molten film forming metal material liquid film 9'.

The proper gap can best be determined by pressing the inner coaxial nozzle 6 downward with sufficient pressure to completely block-off the flow of film forming metal material and to then very slowly raise the inner coaxial nozzle 6 until a stable system is obtained, i.e. until the microspheres are being formed.

The tapered nozzle construction illustrated in FIG. 3 is as mentioned above the preferred embodiment of the invention. This embodiment can be used to blow film forming metal material compositions at relatively high viscosities as well as to blow film forming metal material compositions at the relatively low viscosities referred to with regard to FIG. 2 of the drawings. The FIG. 3 embodiment of the invention is of particular advantage in blowing the thin walled microspheres.

When blowing high or low viscosity film forming metal material compositions, it is found to be advantageous to obtain a very thin molten metal fluid film and to continue during the blowing operation to supply molten metal to the elongated cylinder shaped liquid film as it was formed. Where a high pressure is used to squeeze, i.e. extruded, the molten metal through the very thin gap, the pressure of the inert blowing gas or metal vapor is generally less than the molten metal feed pressure, but slightly above the pressure of the molten metal at the coaxial blowing nozzle.

The tapered nozzle configuration of FIG. 3 is also particularly useful in aligning the laminar plane-orientable film forming metal material additive materials. The passage of the metal material through the fine or narrow gap serves to align the additive materials with the walls of the microspheres as the microspheres are being formed.

The FIG. 3 also shows an embodiment of the invention in which a heating coil is provided around the blowing nozzle. The heating coil is high enough above the orifice 7a such that it does not interfere with blowing the microspheres, but low enough to provide accurate temperature control of the molten film forming metal composition. The heat can be provided by conduction or induction heating or radio frequency radiation methods.

The FIGS. 3a and 3b of the drawings also illustrate a preferred embodiment of the invention in which the transverse jet 13 is flattened to form a generally rectangular or oval shape. The orifice 13a can also be flattened to form a generally oval or rectangular shape. The width of the orifice can be 0.96 to 0.030 inch, preferably 0.60 to 0.045 inch and more preferably 0.030 to 0.060 inch. The height of the orifice can be 0.32 to 0.010 inch, preferably 0.20 to 0.015 inch and more preferably 0.10 to 0.020 inch.

With reference to FIG. 3c of the drawings which illustrates an embodiment of the present invention in which a high viscosity film forming metal material or composition is used to blow filamented hollow film forming metal material microspheres, there is shown the formation of the uniform diameter microspheres spaced about equal distances apart. The numbered items in this drawing have the same meanings as discussed above with reference to FIGS. 1, 2, 3, 3a and 3b.

DESCRIPTION OF THE MICROSPHERES

The hollow microspheres made in accordance with the present invention can be made from a wide variety of film forming metal materials and metal compositions, particularly metal glass compositions.

The hollow microspheres made in accordance with the present invention can be made from suitable film forming metal compositions. The compositions are preferably stable at relatively high temperatures and resistant to chemical attack, resistant to corrosive and alkali and resistant to weathering as the situation may require.

The compositions that can be used are those that have the necessary viscosities, as mentioned above, when being blown to form stable films and which have a rapid change from the molten or liquid state to the solid or hard state with a relatively narrow temperature change. That is, they change from liquid to solid within a relatively narrowly defined temperature range.

The hollow metal microspheres made in accordance with the present invention are preferably made from a metal glass composition, they can be substantially uniform in diameter and wall thickness, have a hard, smooth surface and are stable at relatively high temperatures, resistant to chemical attack, weathering and diffusion of gases into and/or out of the microspheres. The wall of the microspheres are free or substantially free of any holes, relatively thinned wall portions or sections, sealing tips, trapped gas bubbles, or sufficient amounts of dissolved gases to form bubbles. The microspheres are also free of any latent solid or liquid blowing gas materials or gases.

The microspheres, because the walls are substantially free of any holes, thinned sections, trapped gas bubbles, and/or sufficient amounts of dissolved gases to form trapped bubbles, are substantially stronger than the microspheres heretofore produced. The absence of a sealing tip also makes the microsphere stronger.

To form metal glass alloy microspheres in which the walls of the microspheres are in the form of an amorphous solid, i.e. in the amorphous state, the molten metal glass composition must be cooled rapidly from a temperature above its liquidus temperature to a temperature below its glass temperature. Depending on the composition of the metal glass alloy used, the thickness of the wall of the microsphere and the cooling rate, in some instances the microspheres may not have sufficient time to permit surface tension forces to form the microsphere into a spherical shape. In some situations a microspheroid having an oblate shape, i.e. an elongated shape may be formed. The term microsphere as used herein is intended to include spherical as well as spheroid shaped microspheres. The important feature of the process of the present invention is that under a specified set of operating conditions each microsphere as it is formed is of substantially the same size and shape as the preceding and following microspheres. The formation of spheroid shaped microspheres can also occur when rapid cooling and forming polycrystalline or partially polycrystalline metal film forming material microspheres, e.g. from metal glass alloy compositions.

The term filamented microspheres includes microspheres connected by continuous filaments as well as microspheres which have been massed together and have had some or a major portion of the connecting filaments broken.

The metal microspheres can be made in various diameters and wall thickness, depending upon the desired end use of the microspheres. The microspheres can have an outer diameter of 200 to 10,000 microns, preferably 500 to 6,000 microns and more preferably 1,000 to 4,000 microns. The microspheres can have a wall thickness of 0.1 to 1,000 microns, preferably 0.5 to 400 microns and more preferably 1 to 100 microns.

The microspheres can contain an inert gas at super-atmospheric pressure, about ambient pressure or a partial vacuum in the elongated volume. The partial vacuum can be obtained by using a blowing gas which partially condenses within the microsphere.

The microspheres can contain a high vacuum in the enclosed volume where a metal vapor is used as a blowing gas and the metal vapor is cooled, condenses and deposits as a thin metal coating on the inner wall surface of the hollow microsphere. The pressure in the microsphere will be equal to the vapor pressure of the deposited metal at ambient temperature.

The thickness of the thin deposited metal vapor coating deposited on the inner wall surface of the microsphere will depend on the metal vapor used to blow the microsphere, the pressure of the metal vapor and the size of the microsphere. The thickness of the thin metal coating can be 25 to 1000 Å, preferably 50 to 600 Å, and more preferably 100 to 400 Å.

The diameter and wall thickness of the hollow microspheres will of course affect the average bulk density of the microspheres. The metal microspheres prepared in accordance with the invention will have an average bulk density of 1 to 40 lb/ft$^3$, preferably 1.5 to 35 lb/ft$^3$ and more preferably 2 to 25 lb/ft$^3$. For use in specific embodiments to make low density materials, the hollow metal microspheres can have an average bulk density as low as 0.5 to 1.5, for example 1.0 lb/ft$^3$.

Where the microspheres are formed in a manner such that they are connected by continuous thin metal filaments, that is they are made in the form of filamented microspheres, the length of the connecting filaments can be 1 to 40, usually 2 to 20 and more usually 3 to 15 times the diameter of the microspheres. The diameter, that is the thickness of the connecting filaments, can be 1/5000 to 1/10, usually 1/2500 to 1/20 and more usually 1/1000 to 1/30 of the diameter of the microspheres.

The microspheres can contain a gas at super-atmospheric pressure, about ambient pressure or at partial or hard, i.e. high, vacuum, e.g. $10^{-4}$ to $10^{-5}$ Torr.

Where the microspheres are used in syntactic foam systems, or as filler material in general, the microspheres can have an outer diameter of 500 to 3,000 and can have a wall thickness of 0.5 to 200 microns. When used in syntatic foam systems and as filler materials, the microspheres can have a contained gas pressure of 5 to 100 p.s.i.a., preferably 5 to 75 p.s.i.a. and more preferably 5 to 12 p.s.i.a.

In a preferred embodiment of the invention, the ratio of the diameter to the wall thickness of the microspheres is selected such that the microspheres are flexible, i.e. can be deformed under pressure without breaking.

The microspheres can contain a thin metal layer deposited on the inner wall surface of the microsphere where the blowing gas contains dispersed metal particles. The thickness of the thin metal coating deposited on the inner wall surface of the microsphere will depend on the amount and particle size of the dispersed metal particles or partial pressure of organo metal blowing gas that are used and the diameter of the microsphere. The thickness of the thin metal coating can be 25 to 10,000 Å, preferably 50 to 5,000 Å and more preferably 100 to 1,000 Å.

The strength and thermal heat conductivity characteristics of heat barriers made from the microspheres can be improved by partially flattening the microspheres into an oblate spheroid shape. The strength and thermal conductivity characteristics of the oblate spheroids is further improved by mixing with the oblate spheroids thin metal filaments. The filaments are preferably provided in the form of the filamented microspheres.

The filamented microspheres can as they are formed be drawn and laid on a conveyor belt or drum. A sufficient amount of tension can be maintained on the filamented microspheres as they are formed and drawn to stretch them into the oblate spheroid shape. The filamented microspheres are maintained in that shape for a sufficient period of time to harden. After hardening of the filamented oblate spheroids, they can be laid in a bed and cemented together by sintering or fusion or bonding and can be made into structural forms, e.g. a four by eight-foot formed panel. The panel can be ¼ to 3 inches, for example, ½, 1, 1 ½ or 2 inches, in thickness.

The hollow metal microspheres of the present invention have a distinct advantage of being very strong and capable of supporting a substantial amount of weight. They can thus be used to make a simple light weight, strong, inexpensive self-supporting or load bearing structures and systems.

The hollow metal microspheres of the present invention can be used to design systems having superior strength to weight characteristics.

A mass of the microspheres or filamented microspheres can be cemented or bonded together to form a shaped form or formed mass of the microspheres. The shaped form or formed mass of the microspheres can be cemented together by fusion or sintering or bonded together with an organic or inorganic bonding agent or adhesive.

The microspheres can be made into sheets or other shaped forms by cementing the microspheres together with a suitable resin or other adhesive or by fusing the microspheres together and can be used in new construction.

A formed panel or sheet can be made from several layers of hollow metal microspheres bonded together with a polyester, polyolefin, polyacrylate or polymethyl acrylate resin. The microspheres may also be bonded together with inorganic bonding agents, such as OWENS-CORNING solder glass and solder glass-organic solvent or carrier systems.

The interstices between the microspheres can be filled with smaller microspheres of the present invention, finely divided inert particles, or foam, e.g. of polyurethane, polyester or polyolefin resin foam.

The hollow metal microspheres may be formed into shaped forms, sheets or panels by taking the microspheres directly after they are formed, while still hot and pressing them under pressure into the desired shape. The still hot microspheres when compressed under pressure to some extent are sintered or fused together.

Metal microspheres having selective permeabiltiy to certain gases or liquids can be made by proper selection of the constituents of the film forming metal composition. The amount of a specific metal can be added to the metal composition. The specific metal is selected to be one that can be selectively chemically leached from the metal microsphere. The amount of the selected metal and the degree of chemical leaching will determine to some extent the permeability or pour size of the resulting metal microsphere. A copper and silver metal glass alloy may, for example, be selectively leached with hydrochloric acid to selectively remove some of the copper in the copper and silver metal glass alloy. Hollow metal microspheres can accordingly be produced and used to make or act as selective absorption membranes, e.g. to act as molecular sieves.

EXAMPLES

Example 1

A film forming metal material composition is used to make hollow metal microspheres.

The metal composition is heated to a sufficiently high temperature to form a fluid molten metal. The molten metal just prior to the blowing operation, i.e. just before the beginning of the blowing of the microsphere can have a viscosity of 35 to 60 poises.

The molten metal is fed to the apparatus of FIGS. 1 and 2 of the drawings. The molten metal passes through annular space 8 of blowing nozzle 5 and forms a thin liquid molten metal film across the orifices 6a and 7a. The blowing nozzle 5 has an outside diameter of 0.040 inch and orifice 7a has an inside diameter of 0.030 inch. The thin liquid molten metal film has a diameter of 0.030 inch and a thickness of 0.005 inch. An inert blowing gas consisting of xenon or nitrogen at about the temperature of the molten metal and at a positive pressure is applied to the inner surface of the molten metal film causing the film to distend downwardly into a elongated cylinder shape with its outer end closed and its inner end attached to the outer edge of orifice 7a.

The transverse jet is used to direct an inert entraining fluid which consists of nitrogen at about the temperature of the molten metal over and around the blowing nozzle 5 which entraining fluid assists in the formation and closing of the elongate cylinder shape and the detaching of the cylinder from the blowing nozzle and causing the cylinder to fall free of the blowing nozzel. The transverse jet is aligned at an angle of 35° to 50° relative to the blowing nozzle and a line drawn through the center axis of the transverse jet intersects a line drawn through the center axis of the blowing nozzle 5 at a point 2 to 3 times the outside diameter of the coaxial blowing nozzle 5 above the orifice 7a.

The free falling, i.e. entrained, elongated cylinders quickly assume a spherical shape and are rapidly cooled to about ambient temperature by a dispersion of quench fluid at a temperature of −60° to −100° C. which quickly cools, solidifies and hardens the metal microsphere.

Smooth, hollow metal microspheres having a 2000 to 3000 micron diameter, a 20 to 40 micron wall thickness and filled with xenon or nitrogen gas at an internal container pressure of 3 p.s.i.a. are obtained. The metal microspheres are suitable for use as filler materials.

EXAMPLE 2

A film forming metal material composition is used to make hollow metal vacuum microspheres.

The metal composition is heated to a sufficiently high temperature to form a fluid molten metal. The molten metal just prior to the blowing operation can have a viscosity of 35 to 60 poises.

The molten metal is fed to the apparatus of FIGS. 1 and 3 of the drawings. The molten metal is passed through annular space 8 of blowing nozzle 5 and into tapered portion 21 of outer nozzle 7. The molten metal under pressure is squeezed through a fine gap formed between the outer edge of orifice 6a and the inner surface 22 of the tapered portion 21 of outer nozzle 7 and forms a thin liquid molten metal film across the orifices 6a and 7a'. The blowing nozzle 5 has an outside diameter of 0.05 inch and orifice 7a' has an inside diameter of 0.03 inch. The thin liquid molten metal film has a diameter of 0.03 inch and a thickness of 0.01 inch. A zinc vapor blowing gas at about the same temperature as the molten metal and at a positive pressure is applied to the inner surface of the molten metal film causing the film to distend outwardly into an elongated cylinder shape with its outer end closed and its inner end attached to the outer edge of orifice 7a'.

The transverse jet is used to direct an inert entraining fluid which consists of nitrogen gas at about the same temperature as the molten metal at a linear velocity of 40 to 100 feet a second over and around the blowing nozzle 5 which entraining fluid assists in the formation and closing of the elongated cylinder shape and the detaching of the cylinder from the blowing nozzle and causing the cylinder to fall free of the blowing nozzle. The transverse jet is aligned relative to the blowing nozzle as in Example 1.

The free falling elongated cylinders filled with the zinc vapor quickly assume a sherical shape. The microspheres are contacted with a dispersion of a quench fluid at a temperature of −60° to −100° C. which quickly cools, solidifies and hardens the molten metal prior to cooling and condensing the zinc vapor.

As the microsphere is further cooled, the zinc vapor condenses and deposits on the inner wall surface of the microsphere as a thin zinc metal coating.

Smooth, hollow metal glass microspheres having an about 3000 to 4000 micron diameter, a 30 to 40 micron wall thickness and having a zinc metal coating 325 to 450 Å thick and an internal contained pressure of $10^{-6}$ Torr are obtained.

Example 3

A metal glass alloy composition is used to make hollow metal glass filamented microspheres.

The metal glass composition is heated to a temperature above its liquidus temperature to form a fluid molten metal glass. The molten metal glass just prior to the blowing operation can have a viscosity of 100 to 200 poises.

The molten metal glass is fed to the apparatus of FIGS. 1 and 3 of the drawings under conditions similar to those used in Example 2.

A xenon or nitrogen blowing gas at about the temperature of the molten metal glass and at a positive pressure is applied to the inner surface of the molten metal glass film causing the film to distend outwardly into an elongated cylinder shape with its outer end closed and its inner end attached to the outer edge of orifice 7a'.

The transverse jet is used to direct an entraining fluid which consists of nitrogen gas at about the temperature of the molten metal glass at a linear velocity of 5 to 40 feet a second over and around the blowing nozzle 5 which entraining fluid assists in the formation and closing of the elongated cylinder shape and the detaching of the cylinder from the blowing nozzle while trailing a thin metal glass filament which is continuous with the next microsphere forming at the blowing nozzle. The filamented metal microspheres are otherwise formed in the manner illustrated and described with reference to FIG. 3c of the drawings. The transverse jet is aligned relative to the blowing nozzle as in Example 1.

The entrained elongated filamented cylinder filled with the blowing gas assumes a spherical shape. The filamented microspheres are contacted with a dispersion of a quench fluid at a temperature of −60° to −200° C. which quickly cools, solidifies and hardens the molten metal glass to form filamented metal microspheres having amorphous metal walls. Depending on the quench conditions the connecting metal filaments can also be amorphous metal.

Smooth, hollow filamented metal glass microspheres having an about 1500 to 2500 micron diameter and 1.5 to 5.0 micron wall thickness are obtained. The lengths of the filament portions of the filamented microspheres is 10 to 20 times the diameter of the microspheres.

Example 4

The FIG. 5 of the drawings illustrates the use of the hollow metal microspheres of the present invention in the construction of a formed panel 61. The panel contains multiple layers of uniform sized metal microspheres 62. The microspheres can have a thin deposited layer 63 of a metal deposited on their inner wall surface. The internal volume of the microspheres can contain a hard vacuum or can be filled with a low heat conductivity gas 64.

The hollow metal microspheres can be fused or sintered together by pressing them together while passing an electric current through them. The microspheres may be bonded together by using an inorganic bonding agent such as the CORNING solder glass or solder glass systems or by using an organic resin adhesvie. The formed panel 61 forms a light weight relatively strong metal structure.

Example 5

The FIG. 6 of the drawings illustrates the use of the hollow metal microspheres of the present invention in the construction of a formed panel 71. The panel contains multiple layers of uniform sized flattened oblate spheroid shaped microspheres 72. The oblate spheroid shaped microspheres have an inner wall surface 73. The internal volume of the microsphere can be filled with a gas 74. The flattened configuration of the microspheres substantially reduces the volume of the interstices between the microspheres.

The formed panel 71 can be formed by taking the metal microspheres directly after they are formed, while still hot, and compressing them between two surfaces to sinter or fuse the microspheres together and to form the oblate spheroid shape. Making the formed panel in this manner aviods the necessity of reheating the microspheres after they have cooled to ambient temperatures. The formed panel 71 forms a light weight relatively strong metal structure.

Example 6

The FIG. 7 of the drawings illustrates the use of the metal microspheres of the present invention to form a light weight metal structure 61 having a continuous phase of metal or metal alloy 65 and a discontinuous phase of hollow metal microspheres 62. The light weight metal structure can be made in the form of a panel by uniform mixing or dispersing the metal microspheres (until the desired packing is obtained) in a metal or metal alloy powder, compressing the mixture of metal powder and microspheres to compact the mixture. The mixture is then heated under pressure to melt the metal powder and is then quickly cooled before the blowing gas contained in the metal microsphere can escape. A finished top surface 66 and bottom surface 67 can if desired by applied.

Example 7

The FIG. 7a of the drawings illustrates the use of the metal microspheres of the present invention to form a light weight metal structure 71 having a continuous phase of metal or metal alloy 77 and a discontinuous phase of hollow metal microspheres 72. The light weight metal structure can be made in the form of a panel by uniformly mixing or dispersing the metal microspheres (until the desired packing is obtained) in a metal or metal alloy powder, compressing the mixture to obtain the oblate shaped spheroids while passing an electric current or otherwise heating the mixture. The mixture is heated to a temperature sufficiently high to sinter or fuse the metal powder and metal microspheres together. The temperature used, however, is not high enough to melt or devitrify the metal microspheres where they are made from a metal glass alloy having an amorphous structure. The formed panel containing the oblate shaped metal microspheres can be used as a heat radiation shield.

Example 8

The FIG. 7b of the drawings illustrates an embodiment of the formed wall panel of FIG. 7a in which filamented hollow metal microspheres connected by very thin metal filaments 78 are used. The thin metal filaments 78 are formed between adjacent microspheres when and as the microspheres are blown and join the microspheres together by continuous metal material. The connecting filaments 78 in the formed panel interrupt the wall to wall contact between the microspheres. The use of filamented microspheres to provide the interrupting filaments is particularly advantageous and preferred because the filaments are positively evenly distributed, cannot settle, are supplied in the desired controlled amount, and in the formed panel provide an interlocking structure which serves to strengthen the formed panel.

The oblate spheroid shape microspheres can have the ratio of the height to length of the microsphere of about 1:3. The facing 76 can be uncoated or can have laminated or bonded thereto a finished surface. The backing surface 77 can be uncoated or can be painted or coated with a suitable resin to form a vapor seal.

The formed panels made in accordance with the present invention can be made to have a density gradient in the direction of the front to back of the panel. One of the surfaces can be made to have a relatively high density and high strength, by increasing the proportion of binder or continuous phase to metal microspheres. The other surface can be made to have relatively low density by having a high proportion of metal microspheres to binder or continuous phase. For example, the front one-third of the panel can have an average density of about two to three times that of the average density of the center third of the panel. The density of the back one-third of the panel can be about one-half to one-third that of the center third of the panel.

The formed panels of the instant application can be used to form composite laminate light weight, high strength, high insulation value materials by fusing, sintering or bonding the panels of the instant application to the hollow glass microsphere insulation panels described in applicant's copending application Ser. No. 103,114, filed Dec. 13, 1979, now U.S. Pat. No. 4,303,730 which application is incorporated herein by reference in its entirely.

UTILITY

The hollow metal microspheres of the present invention have many uses.

The microsphere can be used in transformers and electric motors, and in magnetic cores.

The hollow metal microspheres when used as a component in building construction can retard the development and expansion of fires.

The formed metal microsphere panels can be used as magnetic shields. The metal glass microspheres because of their high strength and ductility can be used as a filler material to make shock resistant plastic or resin automobile bumpers.

The metal microsphere of the present invention when made from a film forming metal composition having a high melting temperature can be added directly to a molten metal of a lower temperature and cast in any desired shape or form to form light weight, high strength materials.

The miscrospheres can be bonded together by sintering or suitable resin adhesives and molded into sheets or other forms and used in constructions which require light weight and high strength.

The metal microspheres may be adhered together with known adhesives or binders to produce semi- or rigid cellular type materials for use in manufacturing various products or in construction. The microspheres, because they are made from stable metal compositions, are not subject to degradation by outgassing, aging, moisture, weathering or biological attack and do not produce toxic fumes when exposed to high temperatures or fire. The hollow metal microspheres when used in manufacture of superior light weight structural materials can advantageously be used alone or in combination with fiberglass, styrofoam, polyurethane foam, phenolformadlehyde foam, organic and inorganic binders and the like.

The metal microspheres of the present invention can be used to make insulating materials and insulating wallboard and ceiling tiles. The microspheres can advantageously be used in plastic or resin boat construction to produce high strength hulls and/or hulls which themselves are buoyant.

The metal compositions can also be selected to produce microspheres that will be selectively permeable to specific gases and/or organic molecules. These microspheres can then be used as semi-permeable membranes to separate gaseous or liquid mixtures. The metal microsphere compositions can also be formulated with catalytic metals and used in the chemical process industry.

The process and apparatus described herein can also be used to encapsulate and store gaseous material in hollow metal microspheres of a suitable non-interacting composition, thereby allowing storage or handling of gases generally, and of corrosive and toxic or otherwise hazardous gases specifically. Because of the microspheres small size and relative great strength, the gases may be encapsulated into the hollow microspheres at elevated pressures, thus allowing high pressure storage of these gases. In the case where disposal by geological storage is desired, for example, for poisonous and/or other toxic gases, the gases can be encapsulated in very durable metal alloy composition microspheres which can subsequently be embedded, if desired, in a concrete structure. The metal microspheres of the present invention, because they can be made to contain gases under high pressure, can be used to manufacture fuel targets for laser fusion reactor systems, and since the microspheres are metal they may be suspended in a magnetic field. Applicant's copending application, Ser. No. 179,151, filed Aug. 18, 1980, now U.S. Pat. No. 4,303,432 directed to compressing gaseous materials in a contained volume is incorporated herein by reference and the teachings therein are applicable to the present invention.

These and other uses of the present invention will become apparent to those skilled in the art from the foregoing description and the following appended claims.

It will be understood that various changes and modifications may be made in the invention, and that the scope thereof is not to be limited except as set forth in the claims.

What is claimed:

1. A method for making hollow metal microspheres from a film forming metal material which comprises heating said material, forming a liquid film of said material across an orifice, applying a blowing gas at a positive pressure on the inner surface of the liquid film to blow the film and form the microsphere, subjecting the microsphere during its formation to an external pulsating or fluctuating pressure field having periodic osciallations, said pulsating or fluctuating pressure field acting on said microsphere to assist in its formation and to assist in detaching the microsphere from said orifice.

2. The method of claim 1 wherein the liquid film of film forming metal material if formed across the orifice of a coaxial blowing nozzle, said blowing nozzle having an inner nozzle to convey said blowing gas to the inner surface of the liquid film, and an outer nozzle to convey said material to said orifice and pulsating or fluctuating pressure inducing means is directed at an angle to said coaxial blowing nozzle to induce said pulsating or fluctuating pressure field at the opposite or lee said of said coaxial blowing nozzle in the wake or shadow of said coaxial blowing nozzle.

3. The method of claim 1 wherein an entraining fluid is directed at an angle to a coaxial blowing nozzle having an orifice, an inner nozzle and an outer nozzle, the liquid film of film forming metal material is formed across the orifice, the blowing gas is conveyed to the inner surface of the liquid film through said inner nozzle, the film forming metal material is conveyed through said outer nozzle to said orifice, and the entraining fluid passes over and around said coaxial nozzle to fluid dynamically induce the pulsating or fluctuating pressure field at the opposite or lee side of the blowing nozzle in the wake or shadow of the coaxial blowing nozzle.

4. The method of claim 3 wherein the lower portion of the outer nozzle is tapered inwardly to form with the outer edge of the orifice of the inner nozzle a fine gap and the film forming metal material is fed under pressure and extruded through said gap to form a thin film of film forming metal material across the orifice of the blowing nozzle.

5. The method of claim 3 wherein said entraining fluid is directed at said coaxial blowing nozzle at an angle of 15° to 85° relative to a line drawn through the center axis of said coaxial blowing nozzle and said outer nozzle.

6. The method of claim 3 wherein said entraining fluid intersects said coaxial blowing nozzle at a point 0.5 to 4 times the outside diameter of the coaxial blowing nozzle above the orifice of said blowing nozzle.

7. The method of claim 3 wherein quench means direct a quench fluid into contact with said microsphere to rapidly cool and solidify said microsphere.

8. The method of claim 3 wherein the film forming metal material has a viscosity of 10 to 600 poises.

9. The method of claim 3 wherein the film forming metal material has a viscosity of 20 to 100 poises.

10. The method of claim 3 wherein the film forming metal material has a viscosity of 100 to 400 poises.

11. The method of claim 3 wherein said entraining fluid has a linear velocity in the region of microsphere formation of 1 to 120 ft/sec and entrains and transports the microsphere away from the blowing nozzle.

12. The method of claim 11 wherein said entraining fluid has a linear velocity in the region of microsphere formation of 40 to 100 ft/sec.

13. The method of claim 11 wherein said entraining fluid has a linear velocity in the region of microsphere formation of 5 to 40 ft/sec.

14. A method for making hollow metal microspheres which comprises heating a film forming metal composition to form molten metal, forming a liquid film of molten metal across an orifice, applying a blowing gas at a positive pressure on the inner surface of the liquid film to blow the film and form a microsphere, subjecting the microsphere during its formation to a pulsating or fluctuating pressure field having periodic oscillations, said pulsating or fluctuating pressure field acting on said microsphere to assist in its formation and to assist in detaching the microsphere from said orifice.

15. The method of claim 14 wherein said liquid film of molten metal is formed across the orifice of a coaxial blowing nozzle, said blowing nozzle having an inner nozzle to convey said blowing gas to the inner surface of the liquid film, and an outer nozzle to convey said molten metal to said orifice and pulsating or fluctuating pressure inducing means is directed at an angle to said coaxial blowing nozzle to induce said pulsating or fluctuating pressure field at the opposite or lee said of said coaxial blowing nozzle in the wake or shadow of said coaxial blowing nozzle.

16. A method for making hollow film forming metal material microspheres which comprises heating said metal material to form molten metal, forming a liquid film or molten metal across an orifice of a coaxial blowing nozzle, said blowing nozzle having an inner nozzle to convey a blowing gas to the inner surface of the liquid film and an outer nozzle to convey said molten metal to said orifice, applying said blowing gas through said inner nozzle at positive pressure on the inner surface of the liquid film to blow the film downwardly and outwardly to form the microsphere, continuously feeding said molten metal to said outer nozzle while said microsphere is being formed, directing an entraining fluid at said coaxial blowing nozzle at an angle relative to a line drawn through the center axis of said coaxial blowing nozzle, said entraining fluid passing over and around said coaxial blowing nozzle to fluid dynamically induce a pulsating or fluctuating pressure field having periodic oscillations at the opposite or lee side of the blowing nozzle in the wake or shadow of said blowing nozzle, said entraining fluid acting on the microsphere to pinch and close-off the microsphere at a point proximate to the coaxial blowing nozzle and said entraining fluid acting to detach the microsphere from the coaxial blowing nozzle and rapidly cooling and solidifying said microsphere.

17. The method of claim 16 wherein the lower portion of the outer nozzle is tapered inwardly to form with the outer edge of the orifice of the inner nozzle a fine gap and feeding the molten metal under pressure through said gap to form a thin film of molten metal across the orifice of the blowing nozzle.

18. The method of claim 16 wherein said entraining fluid intersects said coaxial blowing nozzle at a point 0.5 to 4 times the outside diameter of the coaxial blowing nozzle above the orifice of said blowing nozzle and said entraining fluid is directed at said coaxial blowing nozzle through a transverse jet disposed a distance of 0.5 to 14 times the outside diameter of the coaxial blowing nozzle away from the point of intersect of a line drawn along the center axis of the transverse jet and a line drawn along the center axis of the coaxial blowing nozzle.

19. The method of claim 16 wherein the blowing gas is a metal vapor, the microsphere is cooled, hardened and solidified and a thin metal coating is deposited on the inner wall surface of the microsphere.

20. The method of claim 16 wherein the metal microspheres have a 200 to 10,000 micron diameter.

21. The method of claim 16 wherein the metal microspheres have a wall thickness of 0.1 to 1,000 microns.

22. A method for making hollow film forming metal material microspheres which comprises heating metal glass alloy material to form molten metal, forming a liquid film of molten metal across an orifice of a coaxial blowing nozzle, said blowing nozzle having an inner nozzle to convey blowing gas to the inner surface of the liquid film and an outer nozzle to convey molten metal to said orifice, the lower portion of said outer nozzle being tapered inwardly to form with the outer edge of the inner nozzle a fine gap, feeding the molten metal under pressure through said gap and forming said thin film of molten metal across said orifice of the blowing nozzle, applying said blowing gas through said inner nozzle at positive pressure on the inner surface of the liquid film to blow the film downwardly and outwardly to form a microsphere, continuously feeding said molten metal to said outer nozzle while said microsphere is being formed, directing an entraining fluid at said coaxial blowing nozzle at an angle relative to a line drawn through the center axis of said coaxial blowing nozzle, said entraining fluid passing over and around said coaxial blowing nozzle to fluid dynamically induce a pulsating or fluctuating pressure field having periodic oscillations at the opposite or lee side of the blowing nozzle in the wake or shadow of said blowing nozzle, said entraining fluid acting on the microsphere to pinch and close-off the microsphere at a point proximate to the coaxial blowing nozzle and said entraining fluid acting to detach the microsphere from the coaxial blowing nozzle, and rapidly cooling, solidifying and hardening said microsphere to obtain microspheres having a 500 to 6,000 microns diameter and a 0.5 to 400 microns wall thickness.

23. The method of claim 22 wherein the microspheres are partially flattened to form oblate spheroids.

24. The method of claim 22 wherein the microspheres have a substantially uniform diameter.

25. A method for making filamented, hollow film forming metal material microspheres which comprises heating metal glass alloy material to form molten metal, forming a liquid film of molten metal across an orifice of a coaxial blowing nozzle, said blowing nozzle having an inner nozzle to convey blowing gas to the inner surface of the liquid film and an outer nozzle to convey molten metal to said orifice, the lower portion of said outer nozzle being tapered inwardly to form with the outer edge of the inner nozzle a fine gap, feeding the molten metal under pressure through said gap and forming said thin film of molten metal across said orifice of the blowing nozzle, applying said blowing gas through said inner nozzle at positive pressure on the inner surface of the liquid film to blow the film downwardly and outwardly to form a microsphere, continuously feeding said molten metal to said outer nozzle while said microsphere is being formed, directing an entraining fluid at said coaxial blowing nozzle, at a linear velocity in the region of microsphere formation of about 1 to 50 feet per second to obtain a connecting metal filament which is continuous with said microsphere and the next microsphere forming at the blowing nozzle, and at an angle relative to a line drawn through the center axis of said coaxial blowing nozzle, said entraining fluid passing over and around said coaxial blowing nozzle to fluid dynamically induce a pulsating or fluctuating pressure field having periodic oscillations at the opposite or lee side of the blowing nozzle in the wake or shadow of said blowing nozzle, said entraining fluid acting on the microsphere to pinch and close-off the microsphere at a point proximate to the coaxial nozzle and said entraining fluid acting to detach the microsphere and connecting metal filament from the coaxial blowing nozzle, and rapidly cooling, solidifying and hardening said microsphere and connecting metal filament to obtain microspheres having a 500 to 6,000 microns diameter and a 0.5 to 400 microns wall thickness, said mircospheres being connected by thin filamented portions between microspheres that are continuous with the metal glass alloy material microspheres.

26. The method of claim 25 wherein the microspheres are partially flattened to form oblate spheriods.

27. The method of claim 25 wherein said microspheres are formed with each microsphere being connected by a metal filament to the next microsphere and wherein the length of the connecting filaments is substantially equal and is 2 to 20 times the diameter of the microspheres.

28. The method of claim 25 wherein the length of the connecting filaments is substantially equal and the diameter of the connecting filaments of 1/2500 to 1/20 the diameter of the microspheres.

29. The method of claim 25 wherein the microspheres have a substantially uniform diameter.

30. The method of claim 22 wherein the metal glass alloy is heated to a temperature above its liquidus temperature to form the molten metal glass alloy and the microspheres are rapidly cooled to a temperature below the glass temperature of the metal glass alloy.

31. The method of claim 30 wherein the metal glass alloy microspheres are cooled at a rate $10^4$ to $10^{6°}$ C. per second.

32. The method of claim 25 wherein the metal glass alloy is heated to a temperature above its liquidus temperature to form the molten metal glass alloy and the microspheres are rapidly cooled to a temperature below the glass temperature of the metal glass alloy.

33. The method of claim 32 wherein the metal glass alloy microspheres are cooled at a rate of $10^4$ to $10^{6°}$ C. per second.

* * * * *